(12) United States Patent
Imai et al.

(10) Patent No.: US 10,734,548 B2
(45) Date of Patent: Aug. 4, 2020

(54) FREE-STANDING SUBSTRATE COMPRISING POLYCRYSTALLINE GROUP 13 ELEMENT NITRIDE AND LIGHT-EMITTING ELEMENT USING SAME

(71) Applicant: NGK INSULATORS, LTD., Nagoya, Aichi (JP)

(72) Inventors: Katsuhiro Imai, Nagoya (JP); Yoshitaka Kuraoka, Okazaki (JP); Mikiya Ichimura, Ichinomiya (JP); Takayuki Hirao, Nisshin (JP)

(73) Assignee: NGK INSULATORS, LTD., Nagoya, Aichi (JP)

( * ) Notice: Subject to any disclaimer, the term of this patent is extended or adjusted under 35 U.S.C. 154(b) by 0 days.

(21) Appl. No.: 16/059,783

(22) Filed: Aug. 9, 2018

(65) Prior Publication Data

US 2018/0351041 A1    Dec. 6, 2018

Related U.S. Application Data

(63) Continuation of application No. PCT/JP2017/004896, filed on Feb. 10, 2017.

(30) Foreign Application Priority Data

Feb. 25, 2016 (JP) .................... 2016-034005

(51) Int. Cl.
*H01L 33/32* (2010.01)
*H01L 33/18* (2010.01)
(Continued)

(52) U.S. Cl.
CPC ............... *H01L 33/32* (2013.01); *C30B 9/12* (2013.01); *C30B 19/02* (2013.01); *C30B 19/12* (2013.01);
(Continued)

(58) Field of Classification Search
CPC ............ H01L 21/0242; H01L 21/0243; H01L 21/02458; H01L 21/0254; H01L 21/02576;
(Continued)

(56) References Cited

U.S. PATENT DOCUMENTS 7,507,292 B2    3/2009   Sasaki et al.
9,640,720 B2    5/2017   Watanabe et al.
(Continued)

FOREIGN PATENT DOCUMENTS

JP         4001170 B2      8/2007
JP      2010-132556 A      6/2010
(Continued)

OTHER PUBLICATIONS

International Search Report for corresponding application No. PCT/JP2017/004896 (1 pg).
(Continued)

*Primary Examiner* — Seahvosh Nikmanesh
(74) *Attorney, Agent, or Firm* — Flynn Thiel, P.C.

(57) ABSTRACT

A free-standing substrate of a polycrystalline nitride of a group 13 element is composed of a plurality of monocrystalline particles having a particular crystal orientation in approximately a normal direction. The free-standing substrate has a top surface and a bottom surface. The polycrystalline nitride of the group 13 element is gallium nitride, aluminum nitride, indium nitride or a mixed crystal thereof and contains zinc at a concentration of $1\times10^{17}$ atoms/cm$^3$ or more and $1\times10^{20}$ atoms/cm$^3$ or less.

13 Claims, 3 Drawing Sheets

(51) Int. Cl.
*H01L 33/06* (2010.01)
*H01L 31/0392* (2006.01)
*H01L 33/16* (2010.01)
*H01L 21/02* (2006.01)
*C30B 29/68* (2006.01)
*C30B 19/12* (2006.01)
*C30B 29/40* (2006.01)
*H01L 31/0304* (2006.01)
*C30B 19/02* (2006.01)
*C30B 9/12* (2006.01)
*C30B 25/18* (2006.01)
*H01L 29/04* (2006.01)
*H01L 29/165* (2006.01)
*H01L 29/20* (2006.01)

(52) U.S. Cl.
CPC .......... *C30B 25/183* (2013.01); *C30B 29/406* (2013.01); *C30B 29/68* (2013.01); *H01L 21/0242* (2013.01); *H01L 21/0243* (2013.01); *H01L 21/0254* (2013.01); *H01L 21/02458* (2013.01); *H01L 21/02576* (2013.01); *H01L 21/02579* (2013.01); *H01L 21/02625* (2013.01); *H01L 21/02628* (2013.01); *H01L 29/04* (2013.01); *H01L 29/165* (2013.01); *H01L 31/03044* (2013.01); *H01L 31/0392* (2013.01); *H01L 33/06* (2013.01); *H01L 33/16* (2013.01); *H01L 33/18* (2013.01); *H01L 29/2003* (2013.01); *Y02E 10/50* (2013.01)

(58) Field of Classification Search
CPC ......... H01L 21/02579; H01L 21/02625; H01L 21/02628; H01L 29/04; H01L 29/165; H01L 31/03044; H01L 31/0392; H01L 33/06; H01L 33/16; H01L 33/18; H01L 29/2003; C30B 9/12; C30B 19/02; C30B 19/12; C30B 25/183; C30B 29/406; C30B 29/68

See application file for complete search history.

(56) References Cited

U.S. PATENT DOCUMENTS

| | | | |
|---|---|---|---|
| 2002/0011599 | A1 | 1/2002 | Motoki et al. |
| 2006/0183625 | A1 | 8/2006 | Miyahara |
| 2008/0096305 | A1* | 4/2008 | Takai ............... C23C 16/24 438/96 |
| 2010/0158066 | A1* | 6/2010 | Morizumi ............ H01S 5/0281 372/49.01 |
| 2013/0313567 | A1 | 11/2013 | Furuya et al. |
| 2015/0144956 | A1* | 5/2015 | Watanabe ............. H01L 33/32 257/76 |

FOREIGN PATENT DOCUMENTS

| | | |
|---|---|---|
| JP | 2011-068548 | 4/2011 |
| JP | 5039813 B2 | 7/2012 |
| JP | 2012-184144 A | 9/2012 |
| JP | 2013-006762 | 1/2013 |
| JP | 5770905 B1 | 7/2015 |
| WO | WO 2005/003414 A1 | 1/2005 |
| WO | WO 2015/151902 A1 | 10/2015 |

OTHER PUBLICATIONS

International Preliminary Report on Patentability for PCT/JP2017/004896, dated Aug. 28, 2018 (1 pg.).
English translation of Written Opinion of the International Searching Authority for PCT/JP2017/004896, dated Mar. 14, 2017 (4 pgs.).
Chinese Office Action issued in corresponding Chinese Application No. 201780010205.X, dated Mar. 30, 2020, including English translation thereof (12 pages).

* cited by examiner

FREE-STANDING SUBSTRATE COMPRISING POLYCRYSTALLINE GROUP 13 ELEMENT NITRIDE AND LIGHT-EMITTING ELEMENT USING SAME

CROSS-REFERENCE TO RELATED APPLICATIONS

This is a continuation of International Application No. PCT/JP2017/004896, filed Feb. 10, 2017, which claims priority of Japanese Patent Application No. 2016-034005, filed Feb. 25, 2016, the entire contents of which are incorporated herein by reference.

TECHNICAL FIELD

The present invention relates to a free-standing substrate of polycrystalline group 13 element nitride and a light-emitting device using the substrate.

BACKGROUND ART

There have been known light-emitting devices such as light-emitting diodes (LEDs) that use sapphire (α-alumina single crystal) as a monocrystalline substrate, with various types of gallium nitride (GaN) layers formed thereon. For example, light-emitting devices have been mass-produced having a structure in which an n-type GaN layer, a multiple quantum well (MQW) layer with an InGaN quantum well layer and a GaN barrier layer laminated alternately therein, and a p-type GaN layer are formed in a laminated manner in this order on a sapphire substrate. There have also been proposed multilayer substrates suitable for such an application. Patent Document 1, for example, proposes a gallium nitride crystal multilayer substrate including a sapphire base substrate and a gallium nitride crystal layer formed through crystal growth on the substrate.

It will be appreciated that when a GaN layer is formed on a sapphire substrate, dislocation is likely to occur because the GaN layer has a lattice constant and a thermal expansion rate different from those of the sapphire substrate, which is heterogeneous with respect to the GaN layer. Further, since sapphire is an insulating material, on the surface of which no electrode can be formed, it is impossible to form a vertically-structured light-emitting device including electrodes on the front and rear surfaces thereof. LEDs are hence receiving attention in which various types of GaN layers are formed on a gallium nitride (GaN) single crystal. Such a GaN monocrystalline substrate, which is of a homogeneous material with the GaN layers, allows for easy matching in the lattice constant and the thermal expansion rate and is expected to have an increased performance compared to using a sapphire substrate. Patent Document 2, for example, discloses a free-standing n-type gallium nitride monocrystalline substrate with a thickness of 200 μm or more.

However, monocrystalline substrates are generally expensive, though having only a small area. In particular, while cost reduction in manufacturing LEDs using a large-area substrate has been demanded, it is not easy to mass-produce large-area monocrystalline substrates, and the manufacturing cost may contrariwise further increase. Hence, an inexpensive material has been required that can be substituted for gallium nitride or the like of these monocrystalline substrates. There have been proposed polycrystalline gallium nitride free-standing substrates that meet such a requirement. Patent Document 4, for example, discloses a polycrystalline gallium nitride free-standing substrate composed of multiple gallium nitride-based monocrystalline particles that have a particular crystal orientation in approximately the normal direction. Patent Document 3 also describes a polycrystalline gallium nitride free-standing substrate composed of multiple gallium nitride-based monocrystalline particles that have a particular crystal orientation in approximately the normal direction, in which the crystal orientations of the gallium nitride-based monocrystalline particles measured through inverse pole figure mapping of the electron back scatter diffraction (EBSD) on the substrate surface are distributed in a manner inclined at various angles with respect to the particular crystal orientation, with an average inclination angle of 1 to 10 degrees.

Patent Document 3 provides an oriented GaN free-standing substrate in which polycrystalline particles of which the substrate is composed are controlled to have an inclination angle (tilt angle) of 1 to 10 degrees and a light-emitting device. This invention provides a polycrystalline gallium nitride free-standing substrate in which the surface can have a reduced defect density and a light-emitting device using the polycrystalline gallium nitride free-standing substrate to have a high luminous efficiency.

Patent Document 5 provides a high-resistance and low-defect Zn-doped GaN crystal and a method for manufacturing the crystal. The Na-flux method is used as a crystal growth method, in which Zn is added into a flux to cause the growth of a GaN single crystal.

Patent Document 6 provides a method for manufacturing a gallium nitride single crystal. In a mixed flux of Na and an alkali or alkali-earth metal, gallium and nitrogen are reacted with each other to manufacture a gallium nitride single crystal. However, Patent Documents 5, 6 are intended to provide the growth of a single crystal.

CITATION LIST

Patent Documents

Patent Document 1: JP 2012-184144 A
Patent Document 2: JP 2010-132556 A
Patent Document 3: WO 2015/151902 A1
Patent Document 4: JP 5770905 B
Patent Document 5: JP 5039813 B
Patent Document 6: JP 4001170 B

SUMMARY OF THE INVENTION

Technical Problem

If the tilt angle of an oriented GaN crystal is 1 to 10 degrees, it is possible to fabricate a polycrystalline gallium nitride free-standing substrate with a low defect density and also to fabricate a light-emitting device having a high luminous efficiency. However, a change and/or variation in the tilt angle would also cause a change in the concentrations of elements to be taken into the light-emitting layer, resulting in a problem that the emission wavelength might be different from a target wavelength. In order to strictly control the emission wavelength, a smaller tilt angle is desirable and angular alignment is also desirable.

It is hence an object of the present invention to, in a polycrystalline group 13 element nitride free-standing substrate composed of multiple gallium nitride-based monocrystalline particles that have a particular crystal orientation in approximately the normal direction, allow the monocrystalline particles to have a further reduced average tilt angle.

Solution to Problem

The present invention provides a free-standing substrate of a polycrystalline nitride of a group 13 element comprising a plurality of monocrystalline particles having a particular crystal orientation in approximately the normal direction,
wherein the free-standing substrate has a top surface and a bottom surface, and
wherein the polycrystalline nitride of the group 13 element comprises gallium nitride, aluminum nitride, indium nitride or a mixed crystal thereof, and contains zinc at a concentration of $1 \times 10^{17}$ atoms/cm$^3$ or more and $1 \times 10^{20}$ atoms/cm$^3$ or less.

The present invention further provides a free-standing substrate of polycrystalline 13-group element nitride comprising a plurality of monocrystalline particles having a particular crystal orientation in approximately the normal direction,
wherein the free-standing substrate has a top surface and a bottom surface, and
wherein the polycrystalline group 13 element nitride comprises gallium nitride, aluminum nitride, indium nitride or a mixed crystal thereof, and contains calcium at a concentration of $5 \times 10^{15}$ atoms/cm$^3$ or more and $1 \times 10^{19}$ atoms/cm$^3$ or less.

The present invention further provides a light-emitting device comprising:
the free-standing substrate; and
a light-emitting functional layer formed on the free-standing substrate and comprising at least one layer having a single crystal structure in approximately the normal direction and comprising a plurality of semiconductor monocrystalline particles.

Advantageous Effects of the Invention

For example, upon liquid phase epitaxial growth of the group 13 element nitride by the flux method, various elements were added into a flux and the tilt angle was evaluated at the surface of a substrate fabricated from the grown polycrystalline group 13 element nitride. As a result, it was proven that when zinc was added into the crystal at a particular amount, the crystalline particle size was larger at the upper surface, at which the growth was ended, than at the lower surface, at which the growth was started, and the average tilt angle was reduced. When the amount of zinc addition was out of the particular range, there was no particular effect of reducing the average tilt angle, while there occurred a problem with crystal growth.

It was also proven that when calcium was added into the crystal at a particular amount, the crystalline particle size was larger at the upper surface, at which the growth was ended, than at the lower surface, at which the growth was started, and the average tilt angle was reduced. When the amount of calcium addition was out of the particular range, there was no particular effect of reducing the average tilt angle, while there occurred a problem with crystal growth.

On the other hand, when lithium germanium, or the like was added into the polycrystalline group 13 element nitride, the tilt angle was not reduced at the surface.

Such a tilt angle reduction effect has not ever been known that is exhibited, by setting the amount of zinc or calcium addition within a particular range, in the oriented polycrystalline group 13 element nitride.

As a result, the average tilt angle is reduced at the upper surface when a free-standing substrate of polycrystalline group 13 element nitride is fabricated and, accordingly, when the substrate is used as a base substrate on which a semiconductor device (LED, power device, etc.) is formed, the characteristic variation can be reduced and thereby the performance can be increased.

Figure 1:
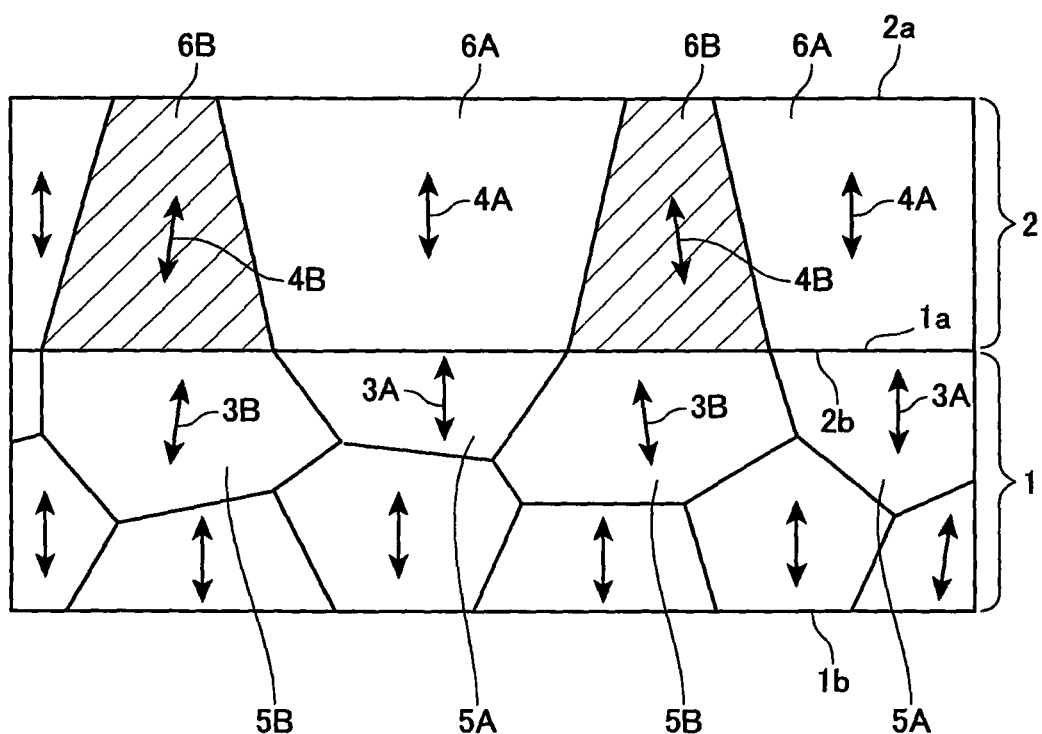
FIG. 1 is a schematic view showing a state of growth of polycrystalline group 13 element nitride in a reference example.

DESCRIPTION OF EMBODIMENTS (Free-Standing Substrate of a Polycrystalline Group 13 Element Nitride)

A group 13 element nitride substrate according to the present invention can have a form of a free-standing substrate. The term "free-standing substrate" as used in the present invention means a substrate that cannot be deformed or broken under its own weight during handling and can be handled as a solid. The free-standing substrate of the present invention can be used not only as a substrate for various types of semiconductor devices such as light-emitting devices, but also as a member or a layer other than the base material, such as an electrode (which may be a p-type electrode or an n-type electrode), a p-type layer, or an n-type layer. It is noted that in the following description, benefits of the present invention may be described by taking a light-emitting device, one of major applications, as an example, and identical or similar benefits also apply to other semiconductor devices without losing the technical consistency.

The free-standing substrate of the present invention is composed of multiple group 13 element nitride monocrystalline particles that have a particular crystal orientation in approximately the normal direction.

The free-standing substrate preferably has a top surface and a bottom surface, and the crystal orientations of gallium nitride-based monocrystalline particles measured through inverse pole figure mapping of the electron back scatter diffraction (EBSD) on the top surface are distributed in a manner inclined at various angles with respect to a particular crystal orientation (e.g. c-axis or a-axis orientation), and the average of the inclination angles (average inclination angle) is equal to or greater than 0.1 degrees and smaller than 1 degree, preferably equal to or greater than 0.1 degrees and equal to or smaller than 0.9 degrees, and more preferably equal to or greater than 0.4 degrees and equal to or smaller than 0.8 degrees.

It is noted the inclination angle as described herein may be referred to as tilt angle and the average inclination angle may be referred to as average tilt angle.

The average cross-sectional diameter DT at the outermost surface of the monocrystalline particles exposed on the top surface of the free-standing substrate is preferably equal to or greater than 10 μm. It is noted that EBSD is a known method in which when a crystalline material is exposed to an electron beam, electron back scatter diffraction occurring on the top surface of the sample causes Kikuchi line diffraction patterns, that is, EBSD patterns to be observed, whereby information on the crystal system and the crystal orientation of the sample can be obtained and, in combination with a scanning electron microscope (SEM), information on the distribution of the crystal system and the crystal orientation across small areas can also be obtained by measuring and analyzing EBSD patterns while scanning an electron beam. Then, with the orientation of the constituent particles being inclined at an average inclination angle of equal to or greater than 0.1 degrees and smaller than 1 degree and the average cross-sectional diameter DT at the outermost surface of the monocrystalline particles exposed on the top surface being equal to or greater than 10 μm, when the free-standing substrate in which the constituent particles have a particular crystal orientation in approximately the normal direction is used to fabricate a device such as a light-emitting device or a photovoltaic cell, it can show good characteristics such as a high luminous efficiency and/or high conversion efficiency among others. The reason, though not known, is presumed to be ascribed to, for example, an effect of an increase in the light-extraction efficiency. A light-emitting functional layer to be formed on the thus arranged free-standing substrate then has a structure in which the orientation is also inclined and thereby is presumed to have an increased light-extraction efficiency. Also, a semiconductor device such as a power device, when fabricated using such a free-standing substrate as described above, can show adequate characteristics.

The multiple monocrystalline particles of which the free-standing substrate is composed have a particular crystal orientation in approximately the normal direction. The particular crystal orientation may be any crystal orientation (e.g. c-plane or a-plane) that gallium nitride can have. For example, if multiple gallium nitride-based monocrystalline particles are oriented in the c-plane in approximately the normal direction, each constituent particle at the top surface of the substrate is to be arranged with the c-axis set in approximately the normal direction (i.e. the c-plane exposed on the top surface of the substrate). The multiple monocrystalline particles of which the free-standing substrate is composed have a particular crystal orientation in approximately the normal direction, while the individual constituent particles are then slightly inclined at various angles. That is, while the entire top surface of the substrate undergoes a predetermined particular crystal orientation in approximately the normal direction, the crystal orientations of the gallium nitride-based monocrystalline particles are distributed in a manner inclined at various angles with respect to the particular crystal orientation. As mentioned above, this specific state of orientation can be evaluated through inverse pole figure mapping of the EBSD on the top surface (plate face) of the substrate (see FIG. 2 of Patent Document 3, for example). That is, the crystal orientations of the gallium nitride-based monocrystalline particles measured through inverse pole figure mapping of the EBSD on the top surface of the substrate are distributed in a manner inclined at various angles with respect to the particular crystal orientation.

The free-standing substrate preferably has a single crystal structure in approximately the normal direction. In this case, the free-standing substrate can be considered to be of a plate composed of multiple gallium nitride-based monocrystalline particles that have a single crystal structure in approximately the normal direction. That is, the free-standing substrate is composed of multiple semiconductor monocrystalline particles linked two-dimensionally in the horizontal direction and therefore can have a single crystal structure in approximately the normal direction. Accordingly, the free-standing substrate is not a single crystal on the whole, but has a single crystal structure per local domain unit. With this arrangement, a device such as a light-emitting feature or a photovoltaic cell, when fabricated, can show adequate characteristics. The reason, though not known, is presumed to be ascribed to the translucency and/or the light-extraction efficiency of the polycrystalline gallium nitride substrate. Making the substrate of gallium nitride made conductive through the introduction of p-type or n-type dopants also allows a light-emitting device with a vertical structure to be achieved and thereby the luminance to be increased. Moreover, it is also possible to achieve a large-area surface-emitting device for use in a surface-emitting illumination or the like at a low cost. Particularly, if the free-standing substrate of this aspect is used to fabricate a vertical LED structure, since the multiple monocrystalline particles of which the free-standing substrate is composed have a single crystal structure in approximately the normal direction, there exists no high-resistance grain boundary in the current path and, as a result, a preferable luminous efficiency is expected. In this regard, for the case of an oriented polycrystalline substrate, in which there exist grain boundaries also in the normal direction, even a vertical structure includes high-resistance grain boundaries in the current path and therefore may undergo a reduction in the luminous efficiency. From these points of view, the free-standing substrate of this aspect can also be used preferably in such a vertical LED structure. Further, since there exists no grain boundary in the current path, the substrate can be applied not only to such a light-emitting device, but also to, for example, a power device and a photovoltaic cell.

The multiple monocrystalline particles of which the free-standing substrate is composed preferably have crystal orientations generally aligned in approximately the normal direction. The phrase "crystal orientations generally aligned in approximately the normal direction" means that they are not necessarily limited to crystal orientations completely aligned in the normal direction, but may be crystal orientations aligned to some extent in the normal direction or its similar direction as long as a device such as a light-emitting device using the free-standing substrate can ensure the desired device characteristics. In a process-derived expression, the gallium nitride-based monocrystalline particles can be considered to have a structure grown in a manner generally following the crystal orientation of an oriented polycrystalline sintered body that is used as a base material upon manufacturing of the free-standing substrate. The phrase "structure grown in a manner generally following the crystal orientation of an oriented polycrystalline sintered body" means a structure provided by crystal growth that is affected by the crystal orientation of the oriented polycrystalline sintered body and is not necessarily limited to a structure grown in a manner completely following the crystal orientation of the oriented polycrystalline sintered body, but may be a structure grown in a manner following, to some extent, the crystal orientation of the oriented polycrystalline sintered body as long as a device such as a light-emitting device using the free-standing substrate can ensure desired device characteristics. That is, this structure includes a structure that grows in a crystal orientation different from that of the oriented polycrystalline sintered body. In this sense, the phrase "structure grown in a manner generally following the crystal orientation" can be translated into the phrase "structure grown in a manner generally derived from the crystal orientation", and the translation and the sense above also apply to similar phrases herein. Accordingly, such crystal growth is preferably epitaxial growth, but not limited thereto and various similar forms of crystal growth may be employed. In any case, the free-standing substrate, if thus grown, can have a structure in which crystal orientations are generally aligned in approximately the normal direction.

It is noted that even when inverse pole figure mapping of the electron back scatter diffraction (EBSD) may be measured on the cross-section orthogonal to the top surface (plate face) of the free-standing substrate, it is possible to recognize that the monocrystalline particles of which the free-standing substrate is composed have particular crystal orientations in approximately the normal direction. However, the crystal orientations are not oriented in a plate face direction orthogonal to the normal direction of the substrate. That is, in this structure, the monocrystalline particles have their respective crystal orientations only in approximately the normal direction, and the twist (crystal axis rotation) distribution of the monocrystalline particles is random axially in approximately the normal direction. With this structure, a device such as a light-emitting feature or a photovoltaic cell, when fabricated using a free-standing substrate, can show adequate characteristics. The reason, though not known, is presumed to be ascribed to an effect of the light-extraction efficiency.

Accordingly, the free-standing substrate of the aspect above can be observed as a single crystal when viewed in the normal direction and can also be taken as a cluster of monocrystalline particles with a columnar structure in which grain boundaries are observed when viewed on the horizontal cross-section. Here, the term "columnar structure" does not mean only a typical vertically long columnar shape, but is defined as including various shapes such as horizontally long shape, trapezoidal shape, and upside-down trapezoidal shape. It will be appreciated that the structure of the free-standing substrate is only required to have crystal orientations aligned to some extent in the normal direction or its similar direction as described above, and a columnar structure in a strict sense is not necessarily required. Such a columnar structure is considered to be due to the fact that the monocrystalline particles grow under the influence of the crystal orientation of the oriented polycrystalline sintered body used for manufacturing of the free-standing substrate as mentioned above. Thus, the average particle diameter of the cross-section (hereinafter referred to as average cross-sectional diameter) of each monocrystalline particle, which may have a columnar structure, may depend not only on film formation conditions, but also on the average particle diameter at the plate face of the oriented polycrystalline sintered body. If the free-standing substrate is used as part of a light-emitting functional layer of a light-emitting device, grain boundaries exist to degrade light transmission in the cross-sectional direction and cause light to be scattered or reflected. This allows to expect an effect of an increase in the luminance by scattered light from the grain boundaries in the case of a light-emitting device with a structure in which light is extracted in the normal direction.

If the free-standing substrate of the present invention is used to provide a vertical LED structure as described above, it is preferred that the top surface of the free-standing substrate on which a light-emitting functional layer is to be formed and the bottom surface of the free-standing substrate on which an electrode is to be formed communicate with each other with no grain boundary therebetween. That is, the monocrystalline particles exposed on the top surface of the free-standing substrate preferably communicate with the bottom surface of the free-standing substrate with no grain boundary therebetween. Grain boundaries, if existing, would provide a resistance during energization, constituting a factor of reducing the luminous efficiency.

Incidentally, the average cross-sectional diameter DT at the outermost surfaces of the monocrystalline particles exposed on the top surface of the free-standing substrate is preferably different from the average cross-sectional diameter DB at the outermost surfaces of the monocrystalline particles exposed on the bottom surface of the free-standing substrate. This improves the crystalline nature of the free-standing substrate and its constituent particles. For example, a group 13 element nitride crystal, when epitaxially grown thorough a gas phase and/or liquid phase, grows not only in the normal direction but also in the horizontal direction, though depending on film formation conditions. In this case, if there is a variation in the quality of the particles from which the growth starts and/or a seed crystal fabricated thereon, the individual single crystals have their respective different growth rate and particles growing at a high rate may grow in a manner covering particles growing at a low rate. In the case of such a growth behavior, particles at the top surface of the substrate are more likely to have a large diameter than at the bottom surface of the substrate. In this case, slowly growing crystals stop growing in the middle, and grain boundaries can be observed also in the normal direction when viewed on one cross-section. However, particles exposed on the top surface of the substrate communicate with the bottom surface of the substrate with no grain boundary therebetween, providing no resistive phase when applying a current. In other words, since dominant ones of the particles exposed on the top surface of the substrate (the side opposite to that on which in contact with the oriented polycrystalline sintered body serving as a base substrate during manufacturing) after the gallium nitride crystal film formation communicate with the bottom surface with no grain boundary therebetween, it is preferable to fabricate a light-emitting functional layer on the top surface of the substrate in terms of increasing in the luminous efficiency of a vertically-structured LED. On the other hand, since the bottom surface of the substrate (the side on which in contact with the oriented polycrystalline sintered body serving as a base substrate during manufacturing) also has a mix of particles not communicating with the top surface of the substrate, fabricating a light-emitting functional layer on the bottom surface of the substrate may cause a reduction in the luminous efficiency. Also, in the case of such a growth behavior, the growth is associated with an increase in the diameter as described above, the surface of the free-standing substrate at which the gallium nitride crystal has a larger particle diameter can be translated into the top surface of the substrate, while the surface having a smaller particle diameter can be translated into the bottom surface of the substrate. That is, in the free-standing substrate, it is preferable to fabricate a light-emitting functional layer on the side where the group 13 element nitride crystal has a larger particle diameter (on the top surface of the substrate) in terms of increase in the luminous efficiency of a vertically-structured LED. It is noted that if an oriented polycrystalline alumina sintered body with, for example, c-plane orientation is used as a base substrate, the top surface of the substrate (the side opposite to that on which in contact with the oriented polycrystalline alumina sintered body serving as a base substrate during manufacturing) serves as a group 13 element surface, while the bottom surface of the substrate (the one which is in contact with the oriented polycrystalline alumina sintered body serving as a base substrate during manufacturing) serves as a nitrogen surface. That is, particles communicating with the bottom surface with no grain boundary therebetween dominate at the group 13 element surface of the free-standing substrate. It is therefore preferable to fabricate a light emitting functional layer on the group 13 element surface (on the top surface of the substrate) in terms of increasing in the luminous efficiency of a vertically-structured LED.

Accordingly, in the case of a growth behavior in which particles at the top surface of the substrate have a larger diameter than particles at the bottom surface of the substrate, that is, the average cross-sectional diameter of monocrystalline particles exposed on the top surface of the substrate is larger than the average cross-sectional diameter of monocrystalline particles exposed on the bottom surface of the substrate, the luminous efficiency preferably increases (this can be translated into the fact that the number of monocrystalline particles exposed on the top surface of the substrate is preferably smaller than the number of monocrystalline particles exposed on the bottom surface of the substrate). Specifically, the ratio DT/DB between the average cross-sectional diameter at the outermost surface of the monocrystalline particles exposed on the top surface of the free-standing substrate (hereinafter referred to as average cross-sectional diameter DT at the top surface of the substrate) and the average cross-sectional diameter at the outermost surface of the monocrystalline particles exposed on the bottom surface of the free-standing substrate (hereinafter referred to as average cross-sectional diameter DB at the bottom surface of the substrate) is preferably greater than 1.0, preferably equal to or greater than 1.1, more preferably equal to or greater than 1.5, further preferably equal to or greater than 2.0, particularly preferably equal to or greater than 3.0, and most preferably equal to or greater than 5.0. However, if the ratio DT/DB is too high, the luminous efficiency may adversely decrease, and therefore the ratio is preferably equal to or smaller than 20 and more preferably equal to or smaller than 10. The cause of such a change in the luminous efficiency, though not known, is considered to be due to the fact that if the ratio DT/DB is high, an increase in the particle diameter causes a reduction in the grain boundary area not contributing to the emission of light or reduction in crystal defects. The cause of such a reduction in the crystal defect, though also not known, can be considered to be due to the fact that defective particles grow at a low rate, while less-defective particles grow at a high rate. On the other hand, if the ratio DT/DB is too high, particles communicating between the top surface and the bottom surface of the substrate (i.e. particles exposed on the top surface of the substrate) have a smaller cross-sectional diameter in the vicinity of the bottom surface of the substrate. This may result in an insufficient current path to cause a reduction in the luminous efficiency, though details are not known.

It will be appreciated that if the columnar structures of which the free-standing substrate is composed, between which the interface has a reduced crystalline nature, are used as a light-emitting functional layer of a light-emitting device, the luminous efficiency may decrease and the emission wavelength may fluctuate and/or become broader. For this reason, the columnar structures preferably have a large average cross-sectional diameter. Specifically, the average cross-sectional diameter DT at the outermost surface of the monocrystalline particles exposed on the top surface of the free-standing substrate is equal to or greater than 10 µm, preferably equal to or greater than 20 µm, more preferably equal to or greater than 50 µm, particularly preferably equal to or greater than 70 µm, and most preferably equal to or greater than 100 µm. The upper limit of the average cross-sectional diameter of the monocrystalline particles at the outermost surface (top surface) of the free-standing substrate is realistically equal to or smaller than 1000 µm, more realistically equal to or smaller than 500 µm, still more realistically equal to or smaller than 200 µm, though not particularly limited thereto. Also, in order to fabricate monocrystalline particles of such an average cross-sectional diameter, the sintered particle diameter at the plate face of the particles of which the oriented polycrystalline sintered body is composed for use in manufacturing the free-standing substrate is desirably equal to or greater than 10 µm, more desirably 10 µm to 1000 µm, further more desirably 10 µm to 800 µm, and particularly desirably 14 µm to 500 µm. Alternatively, bearing in mind that the average cross-sectional diameter of the monocrystalline particles at the outermost surface (top surface) of the free-standing substrate is larger than the average cross-sectional diameter at the bottom surface of the free-standing substrate, the sintered particle diameter at the plate face of the particles of which the oriented polycrystalline sintered body is composed is desirably 10 µm to 100 µm and more desirably 14 µm to 70 µm.

In the present invention, the group 13 element nitride of which the free-standing substrate is composed contains zinc at a concentration of $1 \times 10^{17}$ atoms/cm$^3$ or more and $1 \times 10^{20}$ atoms/cm$^3$ or less. The group 13 element nitride of which the free-standing substrate is composed also contains calcium at a concentration of $5 \times 10^{15}$ atoms/cm$^3$ or more and $1 \times 10^{19}$ atoms/cm$^3$ or less. This indicates that the average tilt angle at the top surface of each single crystal can be reduced significantly. Although details of this mechanism have not yet been clarified, a hypotheses that can be offered at this time will be described with reference to the schematic views in FIGS. 1 and 2.

That is, as shown in FIG. 1, in an oriented polycrystalline substrate 1 serving as a base, crystalline particles 5A, 5B have their respective slightly different crystal orientations 3A, 3B with a variation in the tilt angle. However, a sufficiently oriented poly crystal has a relatively small variation in the tilt angle of crystalline particles, nonetheless, there are particles 5A and 5B, respectively, having a relatively small tilt angle and a relatively large tilt angle. Both the particles 5A and 5B, respectively, having a relatively small tilt angle and a relatively large tilt angle then appear on a film formation surface 1a of the oriented polycrystalline substrate 1. The reference numeral 1b designates the bottom surface.

Here, when polycrystalline group 13 element nitride is epitaxially grown on the oriented polycrystalline substrate 1, monocrystalline particles 6A, 6B grow to result in that the polycrystalline group 13 element 2 is formed as a film. Here, since the crystal orientation 4A of the monocrystalline particle 6A follows the crystal orientation 3A of the particle 5A having a relatively small tilt angle, the monocrystalline particle 6A has a relatively small tilt angle. At the same time, since the crystal orientation 4B of the monocrystalline particle 6B follows the crystal orientation of the particle 5B having a relatively large tilt angle, the monocrystalline particle 6B has a relatively large tilt angle. Then, since both the monocrystalline particles 6A, 6B are exposed on the top surface 2a of the oriented gallium nitride-based poly crystal 2, the average tilt angle at the top surface 2a reflects the tilt angle of the monocrystalline particle 6A and the tilt angle of the particle 6B as well as their areas. It is noted that the reference numeral 2b designates the bottom surface.

Here, the monocrystalline particle 6A having a relatively small tilt angle has a growth rate slightly higher than that of the monocrystalline particle 6B having a relatively large tilt angle and, as the growth progresses, the monocrystalline particle 6A tends to have a diameter larger than that of the particle 6B. This results in that at the top surface 2a of the oriented gallium nitride-based poly crystal 2, the average tilt angle tends to be smaller than at the bottom surface 2b.

Figure 2:
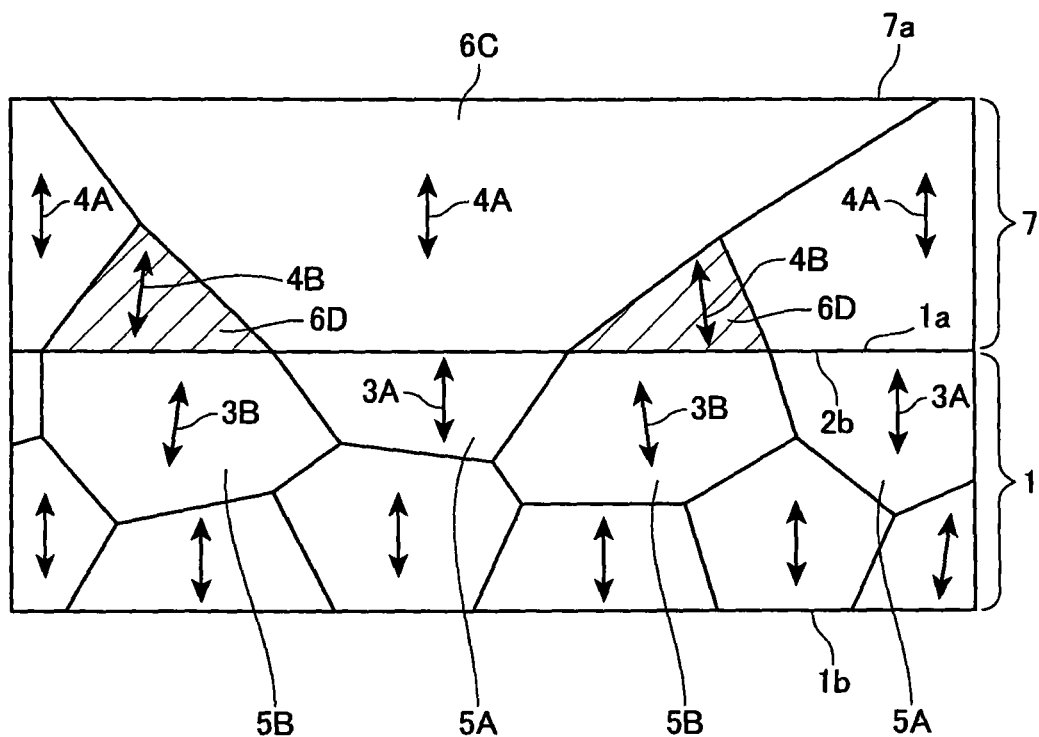
FIG. 2 is a schematic view showing a state of growth of polycrystalline group 13 element nitride in an example of the present invention.

In contrast, when one or both of zinc and calcium are added to the polycrystalline group 13 element nitride, the monocrystalline particle 6C having a relatively small tilt angle is promoted to grow and thereby to have a large diameter, as schematically shown in FIG. 2. In contrast, the monocrystalline particle 6D having a relatively large tilt angle is not promoted to grow and thereby has a gradually reduced diameter, tending to terminate in the middle of film formation. As a result, the monocrystalline particle 6C having a relatively small tilt angle appears on the top surface 7a of the resulting polycrystalline group 13 element nitride 7, while the monocrystalline particle 6D having a relatively large tilt angle tends not to appear or to appear only slightly. This results in that at the top surface 7a of the polycrystalline group 13 element nitride 7, the average tilt angle is significantly smaller than at the bottom surface 7b.

In the present invention, at least one of zinc and calcium is contained in the polycrystalline group 13 element nitride.

Here, if zinc is contained in the polycrystalline group 13 element nitride, the content of zinc is preferably $1 \times 10^{17}$ atoms/cm$^3$ or more and particularly preferably $1 \times 10^{18}$ atoms/cm$^3$ or more in terms of the effect of the present invention. Also, in terms of the prevention of the crystal growth from being inhibited and reduction in the average tilt angle, the content of zinc is preferably $1 \times 10^{20}$ atoms/cm$^3$ or less, more preferably $5 \times 10^{19}$ atoms/cm$^3$ or less, and particularly preferably $1 \times 10^{19}$ atoms/cm$^3$ or less.

Alternatively, if calcium is contained in the polycrystalline group 13 element nitride, the content of calcium is preferably $5 \times 10^{15}$ atoms/cm$^3$ or more and particularly preferably $1 \times 10^{16}$ atoms/cm$^3$ or more in terms of the effect of the present invention. Also, in terms of the suppression of the spontaneous nuclear generation in a melt composition and reduction in the average tilt angle, the content of calcium is preferably $1 \times 10^{19}$ atoms/cm$^3$ or less and further preferably $5 \times 10^{18}$ atoms/cm$^3$ or less.

It is noted that both zinc and calcium may be contained in the group 13 element nitride crystal.

In addition to zinc and calcium, the polycrystalline group 13 element nitride of which the free-standing substrate is composed may be further doped with an n-type dopant or p-type dopant and, in this case, the nitride can be used as a member or a layer other than the base material, such as a p-type electrode, an n-type electrode, a p-type layer, or an n-type layer. A preferable example of p-type dopants may be one or more selected from the group consisting of beryllium (Be), magnesium (Mg), strontium (Sr), and cadmium (Cd). A preferable example of n-type dopants may be one or more selected from the group consisting of silicon (Si), germanium (Ge), tin (Sn), and oxygen (O).

The monocrystalline particles of which the free-standing substrate is composed may be a mixed crystal to control the bandgap. The polycrystalline group 13 element nitride of which the free-standing substrate is composed may preferably consist of gallium nitride mixed with one or more of crystals selected from the group consisting of AlN and InN and may be doped with p-type dopants or n-type dopants. For example, $Al_xGa_{1-x}N$, a mixed crystal of gallium nitride and AlN, can be doped with Mg for use as a p-type substrate, while $Al_xGa_{1-x}N$ can be doped with Si for use as an n-type substrate. If the free-standing substrate is used as a light-emitting functional layer of a light-emitting device, a mixed crystal of gallium nitride and AlN can widen the bandgap and thereby shift the emission wavelength toward the high energy side. A mixed crystal $(In_xGa_{1-x}N)$ of gallium nitride and InN may also be employed to narrow the bandgap and thereby shift the emission wavelength toward the low energy side.

It is noted that the 13-group element nitride of which the free-standing substrate is composed is preferably a gallium nitride crystal or a gallium nitride-based mixed crystal. The gallium nitride-based mixed crystal is represented by $Al_xGa_{1-x}N$ or $In_xGa_{1-x}N$ as described above and, in this case, x is preferably 0.5 or less and more preferably 0.2 or less.

The free-standing substrate preferably has a diameter of 50.8 mm (2 inches) or more in size, more preferably a diameter of 100 mm (4 inches) or more, and further preferably a diameter of 200 mm (8 inches) or more. The larger the size of the polycrystalline gallium nitride free-standing substrate, the more devices can be fabricated thereon, which is preferred in terms of manufacturing cost and also in terms of application for surface-emitting devices because the degree of freedom of the device area increases and thereby a wide range of applications such as surface-emitting illuminations can be achieved, so that no upper limit should be set on the area or the size. It is noted that the free-standing substrate preferably has a circular or substantially circular shape in a top view, but is not limited thereto. The substrate, if not a circular or substantially circular shape, preferably has an area of 2026 mm$^2$ or more, more preferably 7850 mm$^2$ or more, and further preferably 31400 mm$^2$ or more. It will be appreciated that for applications not requiring a large area, the substrate may have an area smaller than the range above, for example, a diameter of 50.8 mm (2 inches) or less, in area terms, 2026 mm$^2$ or less.

The free-standing substrate must have a thickness that allows for free standing and preferably has a thickness of 20 μm or more, more preferably 100 μm or more, and further preferably 300 μm or more. No upper limit should be set on the thickness of the free-standing substrate, but it is realistic to have a thickness of 3000 μm or less in terms of manufacturing cost.

The aspect ratio T/DT, which is defined as a ratio between the thickness T of the free-standing substrate and the average cross-sectional diameter DT at the outermost surface of the monocrystalline particles exposed on the top surface of the free-standing substrate, is preferably equal to or greater than 0.7, more preferably equal to or greater than 1.0, and further preferably equal to or greater than 3.0. This aspect ratio is preferred in terms of increasing the luminous efficiency for the case of an LED. The cause of such an increase in the luminous efficiency is considered to be due to the fact that particles with a higher aspect ratio have a low defect density in gallium nitride and show an increased light-extraction efficiency, though details are not known.

As described heretofore, in terms of increasing the luminous efficiency, (1) a light-emitting functional layer is preferably fabricated on the top surface of the free-standing substrate (the side opposite to that in contact with the oriented polycrystalline sintered body serving as a base substrate during manufacturing), (2) the ratio DT/DB between the average cross-sectional diameter DT at the top surface of the free-standing substrate and the average cross-sectional diameter DB at the bottom surface of the substrate preferably has a moderate value, (3) the average cross-sectional diameter of particles of which the free-standing substrate is composed at the outermost surface of the substrate is preferably large, and (4) the aspect ratio T/DT of particles of which the free-standing substrate is composed is preferably high. In terms of (3) and (4) above, it is preferred that the average cross-sectional diameter is large and the aspect ratio is high, in other words, it is preferred that the average cross-sectional diameter at the top surface of the substrate is large and the polycrystalline group 13 element nitride is thick. Also, in terms of free standing, the free-standing substrate preferably has a thickness of 20 μm or more, more preferably 100 μm or more, and further preferably 300 μm or more. However, as mentioned above, an increase in the thickness of the polycrystalline group 13 element nitride is not preferably in terms of cost, and the nitride is preferably thin as long as it can freely stand. That is, the free-standing substrate realistically has a thickness of 3000 μm or less, preferably 600 μm or less, and more preferably 300 μm or less. Accordingly, in terms of both free standing as well as increasing the luminous efficiency and cost, the thickness is preferably about 50 to 500 μm and further preferably about 300 to 500 μm.

(Manufacturing Method)

Although there is no particular limitation to the method for manufacturing a free-standing substrate according to the present invention, three preferable approaches will hereinafter be exemplified. In any of the approaches, a polycrystalline group 13 element nitride layer is fabricated on an oriented polycrystalline sintered body serving as a base substrate in common.

In a first preferable approach, a polycrystalline group 13 element nitride layer is grown on an oriented polycrystalline sintered body with a small average inclination angle. That is, in the oriented polycrystalline sintered body, the crystal orientations of the monocrystalline particles measured through inverse pole figure mapping of the electron back scatter diffraction (EBSD) on the top surface are distributed in a manner inclined at various angles with respect to a particular crystal orientation, and the average inclination angle is small. There is no particular limitation on the method for growing the group 13 element nitride crystal and, for example, a liquid phase method such as a sodium flux method or a gas phase method such as an HVPE method (hydride vapor phase epitaxy method) may preferably be used. The group 13 element nitride monocrystalline particles grow in a manner generally following the crystal orientation of the oriented polycrystalline sintered body. It is therefore possible to control the average inclination angle of the resulting polycrystalline group 13 element nitride by setting the inclination angle of the particles of which the top surface of the oriented polycrystalline sintered body serving as a base equal to or greater than 0.1 degrees and equal to or smaller than 10 degrees (further equal to or greater than 0.1 degrees and smaller than 1 degree). The oriented polycrystalline sintered body is thus provided as a base substrate for fabricating a free-standing substrate. Although there is no particular limitation on the composition of the oriented polycrystalline sintered body, one selected from an oriented polycrystalline alumina sintered body, an oriented polycrystalline zinc oxide sintered body, and an oriented polycrystalline alumina nitride sintered body is preferred and the oriented polycrystalline alumina sintered body is particularly preferable.

In a second preferable approach, upon growth of a polycrystalline 13-group element nitride layer by an Na flux method, impurities are added into the flux. This allows the average inclination angle of the polycrystalline 13-group element nitride layer to be controlled within a range of, for example, equal to or greater than 0.1 degrees and smaller than 1 degree. That is, even in the case of growth by the Na flux method, the group 13 element nitride crystal grows in a manner generally following the inclination angle of the oriented polycrystalline sintered body serving as a base. However, adding impurities into the Na flux allows the gallium nitride crystal to grow in a manner reducing the inclination angle of the base substrate. For example, when the polycrystalline group 13 element nitride crystal is grown with Ca of about 0.1 mol % added to the Na flux, the inclination angle at the surface of the crystal decreases 10% to 50% from the inclination angle at the top surface of the base substrate. Since the amount of change in the inclination angle when the group 13 element nitride crystal is grown by a flux method varies depending on the type and concentration of the elements added, it is possible to achieve a crystal with an average inclination angle of equal to or greater than 0.1 degrees and smaller than 1 degree through combination with a base substrate having an appropriate inclination angle.

In a third preferable approach, a seed crystal layer or a buffer layer and a seed crystal layer are formed by a gas phase method on a base substrate, and thereafter a polycrystalline group 13 element nitride layer is grown, characterized in that the seed crystal layer or the buffer layer is formed selectively only on particles of the base substrate having small inclination angles. For example, a group 13 element nitride layer (with a thickness of 1 to 10 μm) is formed only on alumina particles having small inclination angles to be a seed crystal layer formed on an alumina substrate, and then the group 13 element nitride crystal is grown selectively by, for example, a flux method or an HVPE method to form a thick polycrystalline group 13 element nitride layer. This allows the average inclination angle of the polycrystalline group 13 element nitride layer to be reduced. It is desired that a gallium nitride layer to be a seed crystal layer is formed by an MOCVD method. In particular, in order to form a gallium nitride layer to be a seed crystal layer on an oriented alumina substrate, it is preferred that a buffer layer is formed only on alumina particles having small inclination angles and a gallium nitride layer is formed on the buffer layer through 1000 to 1150 degrees C. high-temperature growth as a seed crystal layer. It is noted that the high-temperature growth gallium nitride layer can hardly grow on alumina with no buffer layer thereon. As a preferable buffer layer, (i) an InGaN layer may be used or (ii) a low-temperature growth gallium nitride layer may be formed. The above (i) exploits the characteristics that an InGaN layer is formed at a different In composition depending on the inclination angle, in which gallium nitride, which has a low growth rate, is formed on particles having larger inclination angles with no In taken therein, while InGaN, which has a high growth rate, is formed on particles having smaller inclination angles. Then, after raising the temperature to form a high-temperature growth gallium nitride layer, most of the gallium nitride layer, which has a low growth rate, sublimes, and the high-temperature growth gallium nitride layer (seed crystal layer) is formed only on the InGaN layer. On the other hand, the above (ii) is based on the findings that a low-temperature gallium nitride layer on particles having large inclination angles is likely to sublime and exploits it to form a high-temperature gallium nitride layer (seed crystal layer) only on particles having small inclination angles. In any case, at least one of the above-described two types of buffer layers can be used to grow a high-temperature gallium nitride layer to be a seed crystal layer, and a polycrystalline gallium nitride layer can be formed by, for example, a flux method or an HVPE method to be a thick film on the seed crystal layer and then processed into a substrate shape to fabricate an oriented gallium nitride substrate with a small average inclination angle. In the case of (i) above (where InGaN is used as a buffer layer), it is desired that the In composition is set to be 10 to 20 mol %. In this case, the buffer layer is preferably formed in a nitrogen atmosphere at a temperature of 650 to 850 degrees C. On the other hand, in the case of (ii) above (where low-temperature growth gallium nitride is used as a buffer layer), it is desired that the thickness of the buffer layer is set to be 1 nm to 15 nm. In this regard, the thickness of a buffer layer is commonly about 20 nm to 50 nm when a gallium nitride crystal is formed on a sapphire substrate, while in the above (ii), the low-temperature growth gallium nitride on particles having large inclination angles partially sublimes, which requires the buffer layer to be controlled precisely to have a small thickness. In this case, the buffer layer is preferably formed in a hydrogen atmosphere at a temperature of 500 to 550 degrees C.

In any of the above-described three approaches, from the oriented polycrystalline sintered body with the polycrystalline group 13 element nitride layer formed thereon, the oriented polycrystalline sintered body can be removed to obtain a free-standing substrate composed of polycrystalline group 13 element nitride. Although there is no particular limitation on the method for removing the oriented polycrystalline sintered body, grinding processing, chemical etching, interface heating through laser irradiation on the oriented sintered body side (laser lift-off), spontaneous peeling utilizing the thermal expansion difference during temperature rise, or the like may be employed.

(Method for Manufacturing an Oriented Polycrystalline Sintered Body)

The oriented polycrystalline sintered body used as a base material in manufacturing a free-standing substrate according to the present invention may be manufactured by any manufacturing method without particular limitation. It may be fabricated, for example, based on the method described in Patent Document 3 (WO 2015/151902 A1).

It will be appreciated that the method for manufacturing an oriented polycrystalline sintered body according to a preferred aspect of the present invention includes the steps of (a) fabricating a laminated body in which a fine raw material powder layer and a plate-like raw material powder layer with the plate face of plate-like raw material particles arranged to follow the surface of the fine raw material powder layer are laminated alternately and (b) sintering the laminated body.

The fine raw material powder layer used in step (a) is a cluster of fine raw material particles. The fine raw material powder has an average particle diameter smaller than that of the plate-like raw material powder. The fine raw material powder layer may be formed by molding fine raw material powder or formed by molding fine raw material powder including an additive. The additive may be, for example, a sintering agent, graphite, binder, plasticizer, dispersant, or dispersion medium. The molding method may be, for example, tape molding, extrusion molding, cast molding, injection molding, uniaxial press molding, though not particularly limited thereto. The fine raw material powder layer preferably has a thickness of 5 to 100 μm and more preferably 20 to 60 μm.

The plate-like raw material powder layer used in step (a) is a cluster of plate-like raw material particles. The plate-like raw material powder preferably has an aspect ratio of 3 or more. The aspect ratio is defined by average particle diameter/average thickness. Here, the average particle diameter is the average length of the major axis of the particle plate face and the average thickness is the average length of the minor axis of each particle. These values are determined by observing any 100 particles in the plate-like raw material powder with a scanning electron microscope (SEM). In terms of the high orientation of the oriented sintered body, the plate-like raw material powder preferably has a large average particle diameter, preferably equal to or greater than 1.5 μm, more preferably equal to or greater than 5 μm, further preferably equal to or greater than 10 μm, and particularly preferably equal to or greater than 15 μm. However, in terms of densification, it is preferably small, preferably equal to or smaller than 30 μm. Thus, in terms of both a high orientation and densification, the average particle diameter is preferably 1.5 μm to 30 μm. The plate-like raw material powder layer may be formed of a plate-like raw material powder or formed of a plate-like material powder including an additive. The additive may be, for example, a sintering agent, graphite, binder, plasticizer, dispersant, or dispersion medium. In the plate-like raw material powder layer, the plate face of the plate-like raw material particles forming the plate-like raw material powder is arranged in a manner following the surface of the fine raw material powder layer. The plate-like raw material powder is preferably composed of single crystals. In the case of non-single particles, the degree of orientation and/or the inclination angle may be degraded. In order to separate the particles, at least one of classification processing, crush processing, and elutriation processing is only required, but all of them are preferably employed. The classification processing or crush processing is preferably employed in the case of aggregation or the like. The classification processing includes, for example, air flow classification. The crush processing includes, for example, pot crushing and wet atomization. The elutriation processing is preferably employed in the case of the incorporation of fine particulate powder.

The laminated body fabricated in step (a) is formed by laminating a fine raw material powder layer and a plate-like raw material powder layer alternately. Upon fabrication of the laminated body, a one-side processed body may be fabricated by coating one side of a molded body of fine raw material powder entirely or partially with a plate-like raw material powder layer and, using the one-side processed body, a laminated body may be fabricated. Alternatively, a double-side processed body may be fabricated by coating both sides of a molded body of fine raw material powder entirely or partially with a plate-like raw material powder layer and, using the double-side processed body and an unprocessed molded body, a laminated body may be fabricated.

The one-side processed body or the double-side processed body may be fabricated by laminating one side or the both sides of a molded body of a fine raw material powder with a molded body of a plate-like raw material powder with a thickness smaller than that of the molded body. In this case, the molded body of a plate-like raw material powder may be molded by applying a shear force with, for example, tape molding or printing so that the plate face of plate-like raw material particles follows the surface of the molded body. Alternatively, the one-side processed body or the double-side processed body may be fabricated by printing, spray coating, spin coating, or dip coating plate-like raw material powder dispersion onto one side or both sides of a molded body of fine raw material powder. Spray coating, spin coating, or dip coating causes the plate face of plate-like raw material particles to follow the surface of the molded body without forcibly applying a shear force. A few of the plate-like raw material particles arranged at the surface of the molded body may overlap with each other, but preferably do not overlap with the other plate-like raw material particles.

In the case of utilizing such a one-side processed body, it is only required to stack one-side processed bodies such that the fine raw material powder layer and the plate-like raw material powder layer are laminated alternately. In the case of utilizing such a double-side processed body, it is only required to stack double-side processed bodies and unprocessed molded bodies of fine raw material powder alternately. It is noted that both a one-side processed body and a double-side processed body may be utilized to fabricate a laminated body or a one-side processed body, a double-side processed body, and an unprocessed molded body may be utilized to fabricate a laminated body.

In step (b), the laminated body is sintered. In this case, the sintering method is preferably pressure sintering or hydrogen sintering, though not particularly limited thereto. The pressure sintering includes, for example, hot-press sintering and HIP sintering. It is noted that atmospheric pre-sintering may be performed prior to the pressure sintering. A capsule method may be used to perform the HIP sintering. The pressure in the case of hot-press sintering is preferably 50 kgf/cm$^2$ or higher and more preferably 200 kgf/cm$^2$ or higher. The pressure in the case of HIP sintering is preferably 1000 kgf/cm$^2$ or higher and more preferably 2000 kgf/cm$^2$ or higher. The sintering atmosphere is preferably under an inert gas such as atmospheric air, nitrogen, Ar, or vacuum atmosphere, particularly preferably under a nitrogen or Ar atmosphere, and most preferably under a nitrogen atmosphere, though not particularly limited thereto. The laminated body is formed by alternately laminating a fine raw material powder layer of a cluster of fine raw material particles and a plate-like raw material powder layer with the plate face of plate-like raw material particles arranged along the surface of the fine raw material powder layer. When the laminated body is sintered, the plate-like raw material particles forma seed crystal (template), while the fine raw material particles form a matrix, in which the template grows homo-epitaxially while taking in the matrix. Thus, the resulting sintered body is an oriented sintered body, which has a high degree of orientation and small inclination angle. The degree of orientation and the inclination angle depend on the coverage rate at which the plate-like raw material powder covers the surface of the fine raw material powder layer. When the coverage rate is 1 to 60% (preferably 1 to 20%, further preferably 3 to 20%), the degree of orientation is high and the inclination angle is small. The degree of orientation and the inclination angle also depend on the thickness of the fine raw material powder layer. When the thickness of the fine raw material powder layer is 10 to 100 μm (more preferably 10 to 100 μm, further preferably 20 to 60 μm), the degree of orientation is high and the inclination angle is small. The degree of orientation here indicates the degree of c-plane orientation obtained by the Lotgering method using an X-ray diffraction profile, while the inclination angle uses an XRC half-value width (XRC-FWHM).

Although there is no particular limitation on the composition of the oriented polycrystalline sintered body, one type selected from an oriented polycrystalline alumina sintered body, an oriented polycrystalline zinc oxide sintered body, and an oriented polycrystalline aluminum nitride sintered body is preferred. Accordingly, the main component of the fine raw material powder and the plate-like raw material powder may be, for example, alumina, ZnO, AlN and, among these, alumina is preferred. If the main component is alumina, the sintering temperature (topmost temperature) is preferably 1850 to 2050 degrees C. and more preferably 1900 to 2000 degrees C. It is noted that the term "main component" means a component with a mass proportion of 50% (preferably 60%, more preferably 70%, and further preferably 80%) or more to the entire powder.

The oriented sintered body obtained by the manufacturing method of this aspect has a high degree of c-plane orientation and a small inclination angle. For example, it is possible to achieve a degree of c-plane orientation of 80% or higher (preferably 90% or higher and more preferably 96% or higher) obtained by the Lotgering method using an X-ray diffraction profile. As for the inclination angle, it is also possible to achieve an XRC-FWHM of 5 degrees or less (preferably 2.5 degrees or less, more preferably 1.5 degrees or less, and further preferably 1.0 degree or less) measured using an X-ray rocking curve method.

(Light-Emitting Device and Method for Manufacturing the Same)

The above-described free-standing substrate according to the present invention can be used to fabricate a high-quality light-emitting device. As mentioned above, constructing a light-emitting device using the free-standing substrate according to the present invention allows to obtain a high luminous efficiency. The structure and fabricating method of the light-emitting device using the free-standing substrate of the present invention is not particularly limited. Typically, the light-emitting device is fabricated by providing a light-emitting functional layer on the free-standing substrate, and the light-emitting functional layer is preferably formed to have a crystal orientation generally following the crystal orientation of the free-standing substrate by forming one or more layers composed of multiple semiconductor monocrystalline particles that have a single crystal structure in approximately the normal direction. It will be appreciated that the light-emitting device may be fabricated by utilizing the polycrystalline free-standing substrate as a member or a layer other than the base material, such as an electrode (which may be a p-type electrode or an n-type electrode), a p-type layer, or an n-type layer. The device size is not particularly limited, and a small device of 5 mm×5 mm or smaller or a surface-emitting device of 10 cm×10 cm or larger may be provided.

Figure 3:
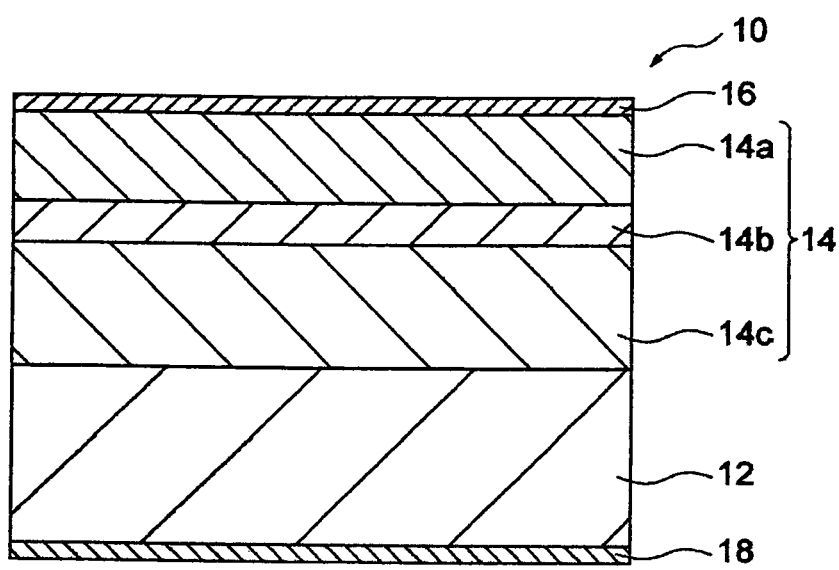
FIG. 3 is a schematic cross-sectional view showing an example vertical light-emitting device fabricated using a free-standing substrate according to the present invention.

FIG. 3 schematically shows the layer configuration of a light-emitting device according to an aspect of the present invention. The light-emitting device 10 shown in FIG. 3 includes a free-standing substrate 12 and a light-emitting functional layer 14 formed on the substrate. The light-emitting functional layer 14 has at least one layer having a single crystal structure in approximately the normal direction and are composed of multiple semiconductor monocrystalline particles. The light-emitting functional layer 14 provides light-emission based on the principle of light-emitting devices such as LEDs by appropriately providing electrodes thereon and applying a voltage therebetween. In particular, using the polycrystalline gallium nitride free-standing substrate 12 of the present invention allows for expecting to obtain a light-emitting device having a luminous efficiency equal to that for the case where a monocrystalline substrate is used, whereby it is possible to achieve significant cost reduction. Making the free-standing substrate of a group 13 element nitride made conductive through the introduction of p-type or n-type dopants also allows a light-emitting device with a vertical structure to be achieved and thereby the luminance to be increased. Moreover, it is also possible to achieve a large-area surface-emitting device at low cost.

The light-emitting functional layer 14 is formed on the substrate 12. The light-emitting functional layer 14 may be provided entirely or partially on the substrate 12 or may be provided entirely or partially on a buffer layer to be described hereinafter if formed on the substrate 12. The light-emitting functional layer 14 has one or more layers composed of multiple semiconductor monocrystalline particles that have a single crystal structure in approximately the normal direction and may take one of various known layer configurations that provides light emission based on the principle of light-emitting devices as represented by LEDs by appropriately providing electrodes and/or phosphors thereon and applying a voltage therebetween. Accordingly, the light-emitting functional layer 14 may emit visible light of, for example, blue and red or may emit ultraviolet light without or with visible light. The light-emitting functional layer 14 preferably forms at least part of a light emitting device that exploits a p-n junction and the p-n junction may include an active layer 14b between a p-type layer 14a and an n-type layer 14c, as shown in FIG. 3. In this case, a double heterojunction or a single heterojunction (hereinafter referred to collectively as heterojunction) may be employed in which the active layer has a bandgap smaller than that of the p-type layer and/or the n-type layer. A quantum well structure in which the active layer is thinned may also be taken as one form of p-type layer/active layer/n-type layer. A double heterojunction in which the active layer has a bandgap smaller than that of the p-type layer and the n-type layer should obviously be employed to obtain a quantum well. Many quantum well structures may also be stacked to provide a multiple quantum well (MQW) structure. These structures allow a higher luminous efficiency compared to a p-n junction. The light-emitting functional layer 14 thus preferably includes a p-n junction, a heterojunction, and/or a quantum well junction having a light-emitting feature.

Accordingly, one or more layers forming the light-emitting functional layer 14 can include at least one or more selected from the group consisting of the n-type layer with n-type dopants doped therein, the p-type layer with p-type dopants doped therein, and the active layer. In the n-type layer, the p-type layer, and the active layer (if exists), the main component may be of the same material or may be of respectively different materials.

The material of each layer forming the light-emitting functional layer 14 is not particularly limited as long as it is grown in a manner generally following the crystal orientation of the free-standing substrate and having a light-emitting feature, but preferably includes one type or more selected from a gallium nitride (GaN)-based material, zinc oxide (ZnO)-based material, and an aluminum nitride (AlN)-based material as the main component and may appropriately contain dopants for controlling to be p-type or n-type. A gallium nitride (GaN)-based material is particularly preferable, which is the same type of material as in the free-standing substrate. The material of the light-emitting functional layer 14 may be a mixed crystal with, for example, AlN, InN, etc. solid-solved in GaN to control the bandgap. As mentioned in the last paragraph, the light-emitting functional layer 14 may employ a heterojunction composed of multiple types of material systems. For example, the p-type layer may employ a gallium nitride (GaN)-based material, while the n-type layer may employ a zinc oxide (ZnO)-based material. Alternatively, the p-type layer may employ a zinc oxide (ZnO)-based material, while the active layer and the n-type layer may employ a gallium nitride (GaN)-based material, the combination of materials being not particularly limited.

Each layer forming the light-emitting functional layer 14 has a single crystal structure in approximately the normal direction and are composed of multiple semiconductor monocrystalline particles. That is, each layer is composed of multiple semiconductor monocrystalline particles linked two-dimensionally in the horizontal direction and therefore has a single crystal structure in approximately the normal direction. Accordingly, each layer of the light-emitting functional layer 14 is not a single crystal on the whole, but has a single crystal structure per local domain unit, which allows it to have a crystalline nature that is high enough to ensure a light-emitting feature. The semiconductor monocrystalline particles of which each layer of the light-emitting functional layer 14 is composed preferably have a structure grown in a manner generally following the crystal orientation of the free-standing substrate, that is, the substrate 12. The phrase "structure grown in a manner generally following the crystal orientation of the polycrystalline group 13 element nitride" means a structure provided by crystal growth that is affected by the crystal orientation of the polycrystalline group 13 element nitride free-standing substrate and is not necessarily limited to a structure grown in a manner completely following the crystal orientation of the free-standing substrate, but may be a structure grown in a manner following, to some extent, the crystal orientation of the free-standing substrate as long as it is capable of ensuring a desired light-emitting feature. That is, this structure includes a structure that grows in a crystal orientation different from that of the oriented polycrystalline sintered body. In this sense, the phrase "structure grown in a manner generally following the crystal orientation" can be translated into the phrase "structure grown in a manner generally derived from the crystal orientation". Accordingly, such crystal growth is preferably epitaxial growth, but not limited thereto and various similar forms of crystal growth may be employed. In particular, if each layer including, for example, the n-type layer, the active layer, and the p-type layer grows in the same crystal orientation as the free-standing substrate, a structure in which the crystal orientation is generally aligned in approximately the normal direction is provided also from the free-standing substrate to between the layers of the light-emitting functional layer, whereby it is possible to have a good light-emitting property. That is, if the light-emitting functional layer 14 is also grown in a manner generally following the crystal orientation of the free-standing substrate 12, the orientation is generally constant in the vertical direction of the substrate. This provides a state equal to that for a single crystal in the normal direction, and if the free-standing substrate is added with n-type dopants, a vertical light-emitting device can be obtained with the free-standing substrate serving as a cathode, while if the polycrystalline gallium nitride free-standing substrate is added with p-type dopants, a vertical light-emitting device can be obtained with the free-standing substrate serving as an anode.

If each layer including, for example, at least the n-type layer, the active layer, and the p-type layer forming the light-emitting functional layer 14 grows in the same crystal orientation, each layer of the light-emitting functional layer 14 can be observed as a single crystal when viewed in the normal direction and can also be taken as a cluster of semiconductor monocrystalline particles with a columnar structure in which grain boundaries are observed when viewed on the horizontal cross-section. Here, the term "columnar structure" does not mean only a typical vertically long columnar shape, but is defined as including various shapes such as horizontally long shape, trapezoidal shape, and upside-down trapezoidal shape. It will be appreciated that the structure of each layer is only required to be grown in a manner following, to some extent, the crystal orientation of the free-standing substrate as described above, and a columnar structure in a strict sense is not necessarily required. Such a columnar structure is considered to be due to the fact that the semiconductor monocrystalline particles grow under the influence of the crystal orientation of the free-standing substrate 12 as mentioned above. Thus, the average particle diameter of the cross-section (hereinafter referred to as average cross-sectional diameter) of each semiconductor monocrystalline particle, which may have a columnar structure, may depend not only on film formation conditions, but also on the average particle diameter at the plate fade of the free-standing substrate. The interfaces in the columnar structure forming the light-emitting functional layer affect the luminous efficiency and the emission wavelength, grain boundaries exist to degrade light transmission in the cross-sectional direction and cause light to be scattered or reflected. This allows to expect an effect of increasing the luminance by scattered light from the grain boundaries in the case of a structure in which light is extracted in the normal direction.

It will be appreciated that the interfaces between the columnar structures forming the light-emitting functional layer 14 have a reduced crystalline nature, and therefore the luminous efficiency may decrease and the emission wavelength may fluctuate and/or become broader. For this reason, the columnar structures preferably have a large average cross-sectional diameter. The average cross-sectional diameter of the semiconductor monocrystalline particles at the outermost surface of the light-emitting functional layer 14 is preferably equal to or greater than 10 µm, more preferably equal to or greater than 15 µm, further preferably equal to or greater than 20 µm, particularly preferably equal to or greater than 50 µm, and most preferably equal to or greater than 70 µm. The upper limit of the average cross-sectional diameter is realistically equal to or smaller than 1000 µm, more realistically equal to or smaller than 500 µm, still more realistically equal to or smaller than 200 µm, though not particularly limited thereto. Also, in order to fabricate semiconductor monocrystalline particles having such an average cross-sectional diameter, the monocrystalline particle substrate forming the free-standing substrate desirably has at its outermost surface an average cross-sectional diameter of 10 µm to 1000 µm and more desirably equal to or greater than 10 µm.

If a non-gallium nitride (GaN)-based material is used partially or entirely in the light-emitting functional layer 14, a buffer layer for suppressing a reaction may be provided between the free-standing substrate 12 and the light-emitting functional layer 14. The main component of such a buffer layer preferably includes one type or more selected from zinc oxide (ZnO)-based material and aluminum nitride (AlN)-based material and may appropriately contain dopants for controlling to be a p-type or n-type, though not particularly limited.

Each layer forming the light-emitting functional layer 14 is preferably composed of 13-group element nitride. For example, an n-type gallium nitride layer and a p-type gallium nitride layer may be grown in this order on the free-standing substrate 12 and the order of lamination of the p-type gallium nitride layer and the n-type gallium nitride layer may be reversed. A preferable example of p-type dopants to be used in the p-type gallium nitride layer may be one type or more selected from the group consisting of beryllium (Be), magnesium (Mg), calcium (Ca), strontium (Sr), zinc (Zn), and cadmium (Cd). A preferable example of n-type dopants to be used in the n-type gallium nitride layer may be one type or more selected from the group consisting of silicon (Si), germanium (Ge), tin (Sn), and oxygen (O). The p-type gallium nitride layer and/or the n-type gallium nitride layer may consist of gallium nitride mixed with one type or more of a crystal selected from the group consisting of AlN and InN, and the p-type layer and/or the n-type layer may be formed by doping the mixed crystal gallium nitride with p-type dopants or n-type dopants. For example, $Al_xGa_{1-x}N$, a mixed crystal of gallium nitride and AlN, can be doped with Mg for use as the p-type layer, while $Al_xGa_{1-x}N$ can be doped with Si for use as the n-type layer. Such a mixed crystal of gallium nitride and AlN can widen the bandgap and thereby shift the emission wavelength toward the high energy side. A mixed crystal of gallium nitride and InN may also be employed to narrow the bandgap and thereby shift the emission wavelength toward the low energy side. Between the p-type gallium nitride layer and the n-type gallium nitride layer, there may be provided an active layer of a mixed crystal of one type or more selected from the group consisting of GaN with a bandgap smaller than that of either of the layers or AlN and InN, and GaN. The active layer has a double heterojunction structure with the p-type layer and the n-type layer, and a thinned version of the active layer corresponds to a light-emitting device having a quantum well structure as one aspect of a p-n junction, whereby the luminous efficiency can be further increased. The active layer may also be composed of a mixed crystal of one type or more selected from the group consisting of GaN with a bandgap smaller than that of one of the layers or AlN and InN, and GaN. Such a single heterojunction can also further increase the luminous efficiency. The gallium nitride-based buffer layer may be composed of undoped GaN or n-type or p-type doped GaN or may be mixed with one type or more of a crystal selected from the group consisting of AlN, InN, or GaN with a similar lattice constant, AlN, and InN.

It will be appreciated that the light-emitting functional layer 14 may be composed of multiple material systems selected from gallium nitride (GaN)-based material, zinc oxide (ZnO)-based material, and aluminum nitride (AlN)-based material. For example, a p-type gallium nitride layer and an n-type zinc oxide layer may be grown on the polycrystalline gallium nitride free-standing substrate 12 and the order of lamination of the p-type gallium nitride layer and the n-type zinc oxide layer may be reversed. If the polycrystalline gallium nitride free-standing substrate 12 is used as part of the light-emitting functional layer 14, an n-type or p-type zinc oxide layer may be formed. A preferable example of p-type dopants to be used in the p-type zinc oxide layer may be one type or more selected from the group consisting of nitrogen (N), phosphorus (P), arsenic (As), carbon (C), lithium (Li), sodium (Na), potassium (K), silver (Ag), and copper (Cu). A preferable example of n-type dopants to be used in the n-type zinc oxide layer may be one type or more selected from the group consisting of aluminum (Al), gallium (Ga), indium (In), boron (B), fluorine (F), chlorine (Cl), bromine (Br), iodine (I), and silicon (Si).

The film formation method for the light-emitting functional layer 14 and the buffer layer is preferably exemplified by a gas phase method such as MOCVD, MBE, HVPE, and sputtering, a liquid phase method such as a Na flux method, ammono-thermal method, hydrothermal method, and sol-gel method, a powder method utilizing the solid phase growth of powder, and combinations thereof, though not particularly limited as long as it is being grown in a manner generally following the crystal orientation of the polycrystalline gallium nitride free-standing substrate. If the light-emitting functional layer 14 is fabricated of a gallium nitride-based material using, for example, an MOCVD method, organometallic gas containing at least gallium (Ga) (e.g. trimethylgallium) and a gas containing at least nitrogen (N) (e.g. ammonia) may flow as a raw material on the substrate so that the layer is grown in an atmosphere containing hydrogen, nitrogen, or both within a temperature range of about 300 to 1200 degrees C. In this case, an organometallic gas containing indium (In), aluminum (Al), and silicon (Si) and magnesium (Mg) as n-type and p-type dopants for bandgap control (e.g. trimethylindium, trimethylaluminum, monosilane, disilane, bis-cyclopentadienylmagnesium) may be appropriately introduced for film formation.

Alternatively, if a non-gallium nitride-based material is used for the light-emitting functional layer 14 and the buffer layer, a seed crystal layer may be formed on the free-standing substrate. The film formation method and material for the seed crystal layer is not limited as long as it promotes the crystal growth generally following the crystal orientation. For example, if a zinc oxide-based material is used partially or entirely in the light-emitting functional layer 14, a vapor phase epitaxy method such as MOCVD method, MBE method, HVPE method, or sputtering method may be used to fabricate an ultrathin zinc oxide seed crystal.

An electrode layer 16 and/or a phosphor layer may further be provided on the light-emitting functional layer 14. As described above, since a light-emitting device using the conductive polycrystalline gallium nitride free-standing substrate 12 can take a vertical structure, an electrode layer 18 may be provided also on the bottom surface of the free-standing substrate 12 as shown in FIG. 3, while the free-standing substrate 12 may be used as an electrode itself and, in this case, the free-standing substrate 12 is preferably added with n-type dopants. The electrode layers 16, 18 are only required to be composed of a known electrode material, and the electrode layer 16 on the light-emitting functional layer 14 is preferably a transparent conductive film such as ITO or a metal electrode with a high aperture ratio of, for example, the lattice structure to increase the efficiency of extraction of light generated in the light-emitting functional layer 14.

If the light-emitting functional layer 14 can emit ultraviolet light, a phosphor layer for converting ultraviolet light into visible light may be provided on the outside of the electrode layer. The phosphor layer is not particularly limited as long as it contains known fluorescent components capable of converting ultraviolet light into visible light. For example, a fluorescent component excited by ultraviolet light to emit blue light, a fluorescent component excited by ultraviolet light to emit blue to green light, and a fluorescent component excited by ultraviolet light to emit red light are preferably mixed to provide white light as a mixed color. A preferable combination of such fluorescent components may include $(Ca,Sr)_5(PO_4)_3Cl:Eu$, $BaMgAl_{10}O_{17}:Eu$, and Mn, $Y_2O_3S:Eu$, and these components are preferably dispersed in a resin such as a silicone resin to form a phosphor layer. Such fluorescent components are not limited to the materials exemplified above, and other ultraviolet-excited phosphors may be combined such as yttrium aluminum garnet (YAG) or silicate-based phosphors and oxynitride-based phosphors.

On the other hand, if the light-emitting functional layer 14 can emit a blue light, a phosphor layer for converting blue light into yellow light may be provided on the outside of the electrode layer. The phosphor layer is not particularly limited as long as it contains known fluorescent components capable of converting blue light into yellow light. For example, it may be combined with a phosphor that emits yellow light, such as YAG. This causes blue emission through the phosphor layer and yellow emission from the phosphor to be complementary and thereby to serve as a pseudo white light source. It is noted that the phosphor layer may contain both a fluorescent component for converting blue into yellow and a fluorescent component for converting ultraviolet light into visible light to convert ultraviolet light into visible light as well as convert blue light into yellow light.

(Application)

The free-standing substrate according to the present invention can preferably be utilized not only for the above-described light-emitting device, but also for various applications such as various types of electronic devices, power devices, light-receiving devices, and photovoltaic cell wafers.

EXAMPLES

The present invention will be described more specifically with reference to the following examples.

First Reference Example: Ge-doped Gallium Nitride Free-Standing Substrate (1) Fabrication of a c-Plane Oriented Alumina Sintered Body (1a) Fabrication of a Laminated Body 100 parts by mass of fine alumina powder (TM-DAR (average particle diameter of 0.1 μm) from Taimei Chemicals Co., Ltd.) was added and mixed with 0.0125 parts by mass (125 ppm by mass) of magnesium oxide (500 A from Ube Material Industries), 7.8 parts by mass of polyvinyl butyral (part number BM-2 from Sekisui Chemical Co., Ltd.) as a binder, 3.9 parts by mass of di (2-ethylhexyl) phthalate (from Kurogane Kasei Co., Ltd.) as a plasticizer, 2 parts by mass of triolein acid sorbitan (Leodol SP-030 from Kao Corporation) as a dispersant, and 2-ethylhexanol as a dispersion medium. The amount of the dispersion medium was adjusted so that the slurry viscosity was 20000 cP. The thus prepared slurry was shaped by a doctor blade method on a PET film into a sheet with a thickness after drying of 40 μm to be a fine alumina powder layer.

Next, a commercially available plate-like alumina powder (grade YFA10030 from Kinsei Matec Co., Ltd.) was classified in an air flow classifier (TC-15N from Nisshin Engineering Inc.) with the classification point set at 3 μm. The plate-like alumina powder from which coarse particles were thus removed was crushed for 20 hours with cobbled stones with a diameter of 0.3 mm in a pot crusher and, at the end, a fine particulate powder was removed through elutriation. 100 parts by mass of the resulting plate-like alumina powder was added with 500 parts by mass of isopropyl alcohol as a dispersion medium. The resulting dispersion liquid (plate-like alumina slurry) was dispersed for five minutes in an ultrasonic disperser and then sprayed with a spray gun (Spray work-HG airbrush wide from Tamiya Inc.) at a spray pressure of 0.2 MPa and a spray distance of 20 cm onto one side of the fine alumina powder layer to provide a one-side processed body. Upon this, the coverage rate at which the plate-like alumina powder covered the surface of the fine alumina powder layer was 1%.

It is noted that the coverage rate of the one-side processed body was calculated as follows. That is, the surface of the fine alumina powder layer was observed with an optical microscope and the observation photo was image-processed into the part of the plate-like alumina powder and the other part, where the proportion of the area of the plate-like alumina powder to the area of the surface of the fine alumina powder layer in the observation photo was defined as the coverage rate.

The resulting one-side processed body was cut into a circle with a bore of 60 mm and then peeled off from the PET film, laminated into 65 layers such that the sprayed processed surface did not overlap with each other, placed on an Al plate with a thickness of 10 mm, and then put into a package, on which a vacuum was drawn to be vacuum packaging. The vacuum packaging underwent hydrostatic pressing at a pressure of 100 kgf/cm$^2$ in warm water of 85 degrees C. to provide a laminated body.

(1b) Sintering of the Laminated Body

The resulting laminated body was plated in a degreasing furnace and degreased under the conditions of 600 degrees C. and 10 hours. The resulting degreased body was sintered by hot pressing using a graphite mold in nitrogen under the conditions of a sintering temperature (topmost temperature) of 1975 degrees C., four hours, and a surface pressure of 200 kgf/cm$^2$) to provide an alumina sintered body. It is noted that the pressure was maintained until the sintering temperature dropped to 1200 degrees C. and released to be zero within a temperature range of less than 1200 degrees C.

(1c) Fabrication of an Oriented Alumina Substrate

The thus obtained sintered body was fixed on a ceramic surface plate and ground using a grinding stone to #2000 so that the plate face was flat. Next, the plate face was smoothened through lap processing using diamond abrasive grains to provide an oriented alumina sintered body with a bore of 60 mm and a thickness of 0.5 mm as an oriented alumina substrate. The size of the abrasive grains was reduced stepwise from 3 μm to 0.5 μm to increase the flatness. The arithmetic average roughness Ra after processing was 4 nm.

(2) Fabrication of Ge-doped Polycrystalline Gallium Nitride Free-Standing Substrate (2a) Film Formation of a Seed Crystal Layer Next, an MOCVD method was used to form a seed crystal layer on the processed oriented alumina substrate. Specifically, a low-temperature GaN layer was deposited by 30 nm at a susceptor temperature of 530 degrees C. in a hydrogen atmosphere as a buffer layer and then a GaN film with a thickness of 3 μm was laminated at an increased susceptor temperature of 1050 degrees C. in a nitrogen and hydrogen atmosphere to provide a seed crystal substrate.

(2b) Film Formation of a Ge-doped GaN Layer by Na Flux Method

The seed crystal substrate fabricated in the step above was installed at the bottom of a cylindrical flat-bottomed alumina crucible with an inside diameter of 80 mm and a height of 45 mm, and then the crucible was filled with a melt composition in a glove box. The composition of the melt composition was as follows:

metallic Ga: 60 g
metallic Na: 60 g
germanium tetrachloride: 1.85 g.

The alumina crucible was put and sealed in a heat-resistant metal container and then installed on a pedestal capable of rotating a crystal growing furnace. After increasing the temperature and pressure to 870 degrees C. and 3.5 MPa in a nitrogen atmosphere, the solution was rotated with the condition maintained for 100 hours to grow a gallium nitride crystal while stirring. After the crystal growth, three hours were taken for slow cooling back to the room temperature and the growing container was taken out of the crystal growing furnace. Ethanol was used to remove the melt composition remaining in the crucible and the sample with a gallium nitride crystal grown therein was recovered. In the resulting sample, a Ge-doped gallium nitride crystal was grown on the entire 60-mm seed crystal substrate with the crystal having a thickness of 1.4 mm. No cracking was seen.

The oriented alumina substrate of the thus obtained sample was removed through grinding processing using a grinding stone to provide a single body of Ge-doped gallium nitride. The plate face of the Ge-doped gallium nitride crystal was polished to be flattened. Further, the plate face was smoothened through lap processing and CMP to provide a Ge-doped polycrystalline gallium nitride free-standing substrate with a thickness of about 500 μm. The arithmetic average roughness Ra after processing of the surface of the polycrystalline gallium nitride free-standing substrate was 0.2 nm.

(Evaluation of the Average Cross-Sectional Diameter of the Polycrystalline Gallium Nitride Free-Standing Substrate)

In order to measure the average cross-sectional diameter of GaN monocrystalline particles at the outermost surface of the polycrystalline gallium nitride free-standing substrate, a scanning electron microscope was used to take images on the top surface of the free-standing substrate. The field of view was set to be a range within which a straight line can be drawn diagonally in the obtained images so as to intersect with 10 to 30 columnar structures. The lengths of line segments within all individual particles with which any two straight lines drawn diagonally in the obtained images intersect were averaged and multiplied by 1.5 to obtain the average cross-sectional diameter of GaN monocrystalline particles at the outermost surface of the polycrystalline gallium nitride free-standing substrate.

As a result of measurement of the average cross-sectional diameter of GaN monocrystalline particles at the top and bottom surfaces of the polycrystalline gallium nitride free-standing substrate using the above-described method, the average cross-sectional diameter at the top surface was about 140 μm and the average cross-sectional diameter at the bottom surface was about 66 μm. The average cross-sectional diameter was thus larger at the top surface than at the bottom surface and the ratio DT/DB between the average cross-sectional diameter DT at the top surface of the substrate and the average cross-sectional diameter DB at the bottom surface of the substrate was about 2.1. Also, the aspect ratio T/DT of GaN monocrystalline particles, which is calculated as a ratio between the thickness T of the GaN crystal and the average cross-sectional diameter DT at the top surface, was about 3.6.

It is noted that in this example, interfaces could be detected clearly in the scanning microscope images on the top surface, the evaluation above may be performed after thermal etching or chemical etching processing to emphasize interfaces. The evaluation above may also be performed using crystal grain mapping images of an EBSD measurement to be described hereinafter.

(Cross-Sectional EBSD Measurement of the Gallium Nitride Crystal)

Inverse pole figure orientation mapping on the plate face of the polycrystalline gallium nitride free-standing substrate was performed in a field of view of 500 μm×500 μm using a SEM (JSM-7000F from JEOL Ltd.) equipped with an electron back scatter diffraction apparatus (EBSD) (OIM from TSL Solutions Co., Ltd.). Conditions for this EBSD measurement were as follows:

<EBSD Measurement Conditions>
acceleration voltage: 15 kV
irradiation current: $2 \times 10^{-8}$ A
work distance: 15 mm
step width: 2 µm
measurement program: OIM Data Collection.

From the resulting inverse pole figure orientation mapping, the frequency of the inclination angle of constituent particles at the outermost surface from the c-axis direction and the average inclination angle were calculated. It is noted that the frequency of the inclination angle and the average inclination angle were calculated after cleaning up images of the inverse pole figure orientation mapping by the Grain Dilation method using the analysis software OIM Analysis. Clean-up conditions are as follows:

<Clean-Up Conditions Upon EBSD Analysis>
Grain Tolerance Angle: 5 degrees
Minimum Grain Size: 2 pixels.

In the monocrystalline particles forming the gallium nitride, the c-plane was oriented generally in the normal direction. Also, the average inclination angle of particles forming the outermost surface was 0.9 degrees and had a distribution state approximating the Gaussian distribution.

(Measurement of Zinc and Calcium Concentrations of the Gallium Nitride Crystal)

The concentrations of Ca and Zn contained in the gallium nitride free-standing substrate was measured using SIMS (secondary ion mass spectroscopy). Specifically, an apparatus IMS-7f from Cameca GmbH was used and $O_2^+$ or $Cs^+$ was used as primary ionic species to perform SIMS measurements at an acceleration voltage of 5 kV to 15 kV from the surface to a depth of 3 µm in a region of 20×20 µm or φ30 µm and thereby to measure the concentrations of Ca and Zn contained in the gallium nitride crystal.

First Inventive Example: Ca Added and Ge-doped Gallium Nitride Free-Standing Substrate (1) Fabrication of Ge-doped Polycrystalline Gallium Nitride Free-Standing Substrate
(1a) Film Formation of a Seed Crystal Layer An oriented $Al_2O_3$ substrate was fabricated in the same way as in the first reference example and an MOCVD method was used to form a seed crystal layer.

(1b) Film Formation of a Ge-doped GaN Layer by Na Flux Method

A Ge-doped GaN layer was formed in the same way as in the first reference example, except that 0.1 g of Ca was added. In the resulting sample, a Ge-doped gallium nitride crystal was grown on the entire 60-mm seed crystal substrate with the crystal having a thickness of 1.2 mm. No cracking was seen.

The oriented alumina substrate of the thus obtained sample was removed through grinding processing using a grinding stone to provide a single body of Ge-doped gallium nitride. The plate face of the Ge-doped gallium nitride crystal was polished to be flattened. Further, the plate face was smoothened through lap processing and CMP to provide a Ge-doped polycrystalline gallium nitride free-standing substrate with a thickness of about 500 µm. The arithmetic average roughness Ra after processing of the top surface of the polycrystalline gallium nitride free-standing substrate was 0.2 nm.

As a result of a measurement of the average cross-sectional diameter of GaN monocrystalline particles at the top and bottom surfaces of the polycrystalline gallium nitride free-standing substrate in the same way as in the first reference example, the average cross-sectional diameter at the top surface was about 160 µm and the average cross-sectional diameter at the bottom surface was about 66 µm. The average cross-sectional diameter was thus larger at the top surface than at the bottom surface and the ratio DT/DB between the average cross-sectional diameter DT at the top surface of the substrate and the average cross-sectional diameter DB at the bottom surface of the substrate was about 2.4. Also, the aspect ratio T/DT of GaN monocrystalline particles, which is calculated as a ratio between the thickness T of the GaN crystal and the average cross-sectional diameter DT at the top surface, was about 3.1.

As a result of EBSD measurement on the plate face in the same way as in the first reference example, the c-plane was oriented generally in the normal direction in the particles forming the gallium nitride crystal, but the average inclination angle of the particles forming the outermost surface was 0.7 degrees.

Second Inventive Example: Zn-doped Gallium Nitride Free-Standing Substrate (1) Fabrication of Zn-doped Polycrystalline Gallium Nitride Free-Standing Substrate
(1a) Film Formation of a Seed Crystal Layer An oriented $Al_2O_3$ substrate was fabricated in the same way as in the first reference example and an MOCVD method was used to form a seed crystal layer.

(1b) Film Formation of a Zn-doped GaN Layer by Na Flux Method

A Zn-doped GaN layer was formed in the same way as in the first reference example, except that 0.5 g of metal Zn was added instead of germanium tetrachloride. In the resulting sample, a Zn-doped gallium nitride crystal was grown on the entire 60-mm seed crystal substrate with the crystal having a thickness of 1.0 mm. No cracking was seen.

The oriented alumina substrate of the thus obtained sample was removed through grinding processing using a grinding stone to provide a single body of Zn-doped gallium nitride. The plate face of the Zn-doped gallium nitride crystal was polished to be flattened. Further, the plate face was smoothened through lap processing and CMP to provide a Zn-doped polycrystalline gallium nitride free-standing substrate with a thickness of about 500 µm. The arithmetic average roughness Ra after processing of the top surface of the polycrystalline gallium nitride free-standing substrate was 0.2 nm.

As a result of measurement of the average cross-sectional diameter of GaN monocrystalline particles at the top and bottom surfaces of the polycrystalline gallium nitride free-standing substrate in the same way as in the first reference example, the average cross-sectional diameter at the top surface was about 200 µm and the average cross-sectional diameter at the bottom surface was about 70 μm. The average cross-sectional diameter was thus larger at the top surface than at the bottom surface and the ratio DT/DB between the average cross-sectional diameter DT at the top surface of the substrate and the average cross-sectional diameter DB at the bottom surface of the substrate was about 2.9. Also, the aspect ratio T/DT of GaN monocrystalline particles, which is calculated as a ratio between the thickness T of the GaN crystal and the average cross-sectional diameter DT at the top surface, was about 2.5.

In the monocrystalline particles forming the gallium nitride, the c-plane was oriented generally in the normal direction. Also, the average inclination angle of particles forming the outermost surface was 0.6 degrees and had a distribution state approximating the Gaussian distribution.

Second Reference Example: Li-added and Ge-doped Gallium Nitride Free-Standing Substrate (1) Fabrication of Ge-doped Polycrystalline Gallium Nitride Free-Standing Substrate (1a) Film Formation of a Seed Crystal Layer An oriented $Al_2O_3$ substrate was fabricated in the same way as in the first reference example and an MOCVD method was used to form a seed crystal layer.

(1b) Film Formation of a Li-added and Ge-doped GaN Layer by Na Flux Method

A Ge-doped GaN layer was formed in the same way as in the first reference example, except that 0.1 g of metal Li was added. In the resulting sample, a Ge-doped gallium nitride crystal was grown on the entire 60-mm seed crystal substrate with the crystal having a thickness of 0.8 mm. No cracking was seen.

The oriented alumina substrate of the thus obtained sample was removed through grinding processing using a grinding stone to provide a single body of Ge-doped gallium nitride. The plate face of the Ge-doped gallium nitride crystal was polished to be flattened. Further, the plate face was smoothened through lap processing and CMP to provide a Ge-doped polycrystalline gallium nitride free-standing substrate with a thickness of about 500 μm. The arithmetic average roughness Ra after processing of the top surface of the polycrystalline gallium nitride free-standing substrate was 0.2 nm.

As a result of measurement of the average cross-sectional diameter of GaN monocrystalline particles at the top and bottom surfaces of the polycrystalline gallium nitride free-standing substrate in the same way as in the first reference example, the average cross-sectional diameter at the top surface was about 70 μm and the average cross-sectional diameter at the bottom surface was about 60 μm. The average cross-sectional diameter was thus larger at the top surface than at the bottom surface and the ratio DT/DB between the average cross-sectional diameter DT at the top surface of the substrate and the average cross-sectional diameter DB at the bottom surface of the substrate was about 1.2. Also, the aspect ratio T/DT of GaN monocrystalline particles, which is calculated as a ratio between the thickness T of the GaN crystal and the average cross-sectional diameter DT at the top surface, was about 7.1.

In the particles forming the gallium nitride crystal, the c-plane was oriented generally in the normal direction. Also, the average inclination angle of particles forming the outermost surface was 1.3 degrees.

Third Reference Example: Gallium Nitride Free-Standing Substrate Grown with No Element Added (1) Fabrication of Undoped Polycrystalline Gallium Nitride Free-Standing Substrate (1a) Film Formation of a Seed Crystal Layer An oriented $Al_2O_3$ substrate was fabricated in the same way as in the first reference example and an MOCVD method was used to form a seed crystal layer.

(1b) Film Formation of a GaN Layer by Na Flux Method

An undoped GaN layer was formed in the same way as in the first reference example with no element added other than metal Ga and metal Na. In the resulting sample, a gallium nitride crystal was grown on the entire 60-mm seed crystal substrate with the crystal having a thickness of 1.6 mm. No cracking was seen.

The oriented alumina substrate of the thus obtained sample was removed through grinding processing using a grinding stone to provide a single body of gallium nitride. The plate face of the undoped gallium nitride crystal was polished to be flattened. Further, the plate face was smoothened through lap processing and CMP to provide an undoped polycrystalline gallium nitride free-standing substrate with a thickness of about 500 μm. The arithmetic average roughness Ra after processing of the top surface of the polycrystalline gallium nitride free-standing substrate was 0.2 nm.

As a result of a measurement of the average cross-sectional diameter of GaN monocrystalline particles at the top and bottom surfaces of the polycrystalline gallium nitride free-standing substrate in the same way as in the first reference example, the average cross-sectional diameter at the top surface was about 130 μm and the average cross-sectional diameter at the bottom surface was about 65 μm. The average cross-sectional diameter was thus larger at the top surface than at the bottom surface and the ratio DT/DB between the average cross-sectional diameter DT at the top surface of the substrate and the average cross-sectional diameter DB at the bottom surface of the substrate was about 2.0. Also, the aspect ratio T/DT of GaN monocrystalline particles, which is calculated as a ratio between the thickness T of the GaN crystal and the average cross-sectional diameter DT at the top surface, was about 3.8.

In the particles forming the gallium nitride crystal, the c-plane was oriented generally in the normal direction. Also, the average inclination angle of particles forming the outermost surface was 1.0 degree.

Third Inventive Example: Ca-added Undoped Gallium Nitride Free-Standing Substrate (1) Fabrication of Undoped Polycrystalline Gallium Nitride Free-Standing Substrate (1a) Film Formation of a Seed Crystal Layer An oriented $Al_2O_3$ substrate was fabricated in the same way as in the first reference example and an MOCVD method was used to form a seed crystal layer.

(1b) Film Formation of a GaN Layer by the Na Flux Method

An undoped GaN layer was formed in the same way as in the third reference example, except that 0.1 g of metal Ca was added. In the resulting sample, a gallium nitride crystal was grown on the entire 60-mm seed crystal substrate with the crystal having a thickness of 1.3 mm. No cracking was seen.

The oriented alumina substrate of the thus obtained sample was removed through grinding processing using a grinding stone to provide a single body of gallium nitride. The plate face of the undoped gallium nitride crystal was polished to be flattened. Further, the plate face was smoothened through lap processing and CMP to provide an undoped polycrystalline gallium nitride free-standing substrate with a thickness of about 500 μm. The arithmetic average roughness Ra after processing of the top surface of the polycrystalline gallium nitride free-standing substrate was 0.2 nm.

As a result of a measurement of the average cross-sectional diameter of the GaN monocrystalline particles at the top and bottom surfaces of the polycrystalline gallium nitride free-standing substrate in the same way as in the first reference example, the average cross-sectional diameter at the top surface was about 150 μm and the average cross-sectional diameter at the bottom surface was about 65 μm. The average cross-sectional diameter was thus larger at the top surface than at the bottom surface and the ratio DT/DB between the average cross-sectional diameter DT at the top surface of the substrate and the average cross-sectional diameter DB at the bottom surface of the substrate was about 2.3. Also, the aspect ratio T/DT of the GaN monocrystalline particles, which is calculated as a ratio between the thickness T of the GaN crystal and the average cross-sectional diameter DT at the top surface, was about 3.3.

In the particles forming the gallium nitride crystal, the c-plane was oriented generally in the normal direction. Also, the average inclination angle of particles forming the outermost surface was 0.7 degrees.

In the above-described examples, the Ca concentration and the Zn concentration in the melt, the Ca concentration and the Zn concentration in the crystal, Ra, the presence or absence of cracking, DT, DB, DT/DB, T/DT, the average tilt angle are summarized in Table 1 below.

TABLE 1

| | Ref. Ex. 1 Ge doped | Ex. 1 Ge + Ca | Ex. 2 Zn doped | Ref. Ex. 2 Ge + Li | Ref. Ex. 3 Undoped | Example 3 Ca doped |
|---|---|---|---|---|---|---|
| Ca concentration in melt | — | 0.3 mol % | — | — | — | 0.3 mol % |
| Zn concentration in melt | — | — | 2 mol % | — | — | — |
| Ca concentration in crystal (/cm3) | — | $8 \times 10^{16}$ | — | — | — | $1 \times 10^{17}$ |
| Zn concentration in crystal (/cm3) | — | — | $3 \times 10^{18}$ | — | — | — |
| Ra | 0.2 nm | 0.2 nm | 0.2 nm | 0.2 nm | 0.2 nm | 0.2 nm |
| Crack | None | None | None | Two lines | None | None |
| DT | 140 um | 160 um | 200 um | 70 um | 130 um | 150 um |
| DB | 66 um | 66 um | 70 um | 60 um | 65 um | 65 um |
| DT/DB | 2.1 | 2.4 | 2.9 | 1.2 | 2 | 2.3 |
| T/DT | 3.6 | 3.1 | 2.5 | 7.1 | 3.8 | 3.3 |
| Tilt angle (degree) | 0.9 | 0.7 | 0.6 | 1.3 | 1.0 | 0.7 |

Third to Sixth Inventive Examples and Fourth and Fifth Reference Examples

In the third Inventive example, the amount of calcium addition to the melt was changed as shown in Table 2. As a result, the calcium concentration in the resulting crystal was changed as shown in Table 2. The Ca concentration in the melt, the Ca concentration in the crystal, Ra, the presence or absence of cracking, DT, DB, DT/DB, T/DT, the average tilt angle of the resulting free-standing substrate are summarized in Table 2 below.

TABLE 2

| | Ref. Ex. 4 Ca doped | Example 4 Ca doped | Example 5 Ca doped | Example 3 Ca doped | Example 6 Ca doped | Ref. Ex. 5 Ca doped |
|---|---|---|---|---|---|---|
| Ca concentration in melt | 0.002 mol % | 0.005 mol % | 0.05 mol % | 0.3 mol % | 0.7 mol % | 1.0 mol % |
| Ca concentration in crystal (/cm3) | $3 \times 10^{15}$ mol % | $1 \times 10^{16}$ | $5 \times 10^{16}$ | $1 \times 10^{17}$ | $5 \times 10^{18}$ | $3 \times 10^{19}$ |
| Ra | 0.2 nm | 0.2 nm | 0.2 nm | 0.2 nm | 0.2 nm | — |
| Crack | None | None | None | None | None | — |
| DT | 130 um | 140 um | 145 um | 150 um | 150 um | — |
| DB | 65 um | 65 um | 65 um | 65 um | 65 um | — |
| DT/DB | 2.0 | 2.2 | 2.2 | 2.3 | 2.3 | — |
| T/DT | 3.8 | 3.6 | 3.4 | 3.3 | 3.3 | — |
| Tilt angle | 1.0° | 0.8° | 0.7° | 0.7° | 0.8° | — |
| Notes | Tilt was not reduced | — | — | — | Micro crystals generated in crucible | Large amount of micro crystals, not grown on substrate |

As is clear from Table 2, containing calcium in the crystal forming the free-standing substrate at a concentration defined in the present invention causes a reduction in the average tilt angle, while the crystal growth is not inhibited.

Second and Seventh to Ninth Inventive Examples and Sixth and Seventh Reference Examples In the second Inventive example, the amount of zinc addition to the melt was changed as shown in Table 3. As a result, the zinc concentration in the resulting crystal was changed as shown in Table 3. The Zn concentration in the melt, the Zn concentration in the crystal, Ra, the presence or absence of cracking, DT, DB, DT/DB, T/DT, the average tilt angle of the resulting free-standing substrate are summarized in Table 3 below.

TABLE 3

|  | Ref. Ez. 6 Zn doped | Example 7 Zn doped | Example 2 Zn doped | Example 8 Zn doped | Example 9 Zn doped | Ref. Ex. 7 Zn doped |
|---|---|---|---|---|---|---|
| Zn concentration in melt | 0.1 mol % | 1 mol % | 2 nol % | 3.5 mol % | 7.5 mol % | 10 mol % |
| Zn concentration in Crystal (/cm3) | $5 \times 10^{16}$ | $1 \times 10^{18}$ | $3 \times 10^{18}$ | $6 \times 10^{18}$ | $1 \times 10^{19}$ | — |
| Ra | 0.2 nm | 0.2 nm | 0.2 nm | 0.2 nm | 0.2 nm | — |
| Crack | None | None | None | None | None | — |
| DT | 150 um | 180 um | 200 um | 250 um | 320 um | — |
| DB | 70 um | 70 um | 70 um | 70 um | 70 um | — |
| DT/DB | 2.1 | 2.6 | 2.9 | 3.6 | 4.6 | — |
| T/DT | 3.3 | 2.8 | 2.5 | 2.0 | 1.6 | — |
| Tilt angle | 1.0° | 0.8° | 0.6° | 0.6° | 0.7° | — |
| Notes | Tilt was not reduced | — | — | — | — | No crystal growth |

As is clear from Table 3, containing zinc in the crystal forming the free-standing substrate at a concentration defined in the present invention causes a reduction in the average tilt angle, while the crystal growth is not inhibited.

The invention claimed is:

1. A free-standing substrate of a polycrystalline nitride of a group 13 element comprising a plurality of monocrystalline particles having a particular crystal orientation in approximately a normal direction,
wherein said free-standing substrate comprising a top surface and a bottom surface,
said polycrystalline nitride of said group 13 element comprises gallium nitride, aluminum nitride, indium nitride or a mixed crystal thereof and contains zinc at a concentration of $1 \times 10^{17}$ atoms/cm$^3$ or more and $1 \times 10^{20}$ atoms/cm$^3$ or less,
crystal orientations of said monocrystalline particles measured through inverse pole figure mapping of electron back scatter diffraction on said top surface are inclined with respect to said particular crystal orientation, and
an average of inclination angles of said crystal orientations with respect to said particular crystal orientation is equal to or greater than 0.1 degrees and smaller than 1 degree.

2. The free-standing substrate of claim 1, wherein an average cross-sectional diameter DT at outermost surfaces of said monocrystalline particles exposed on said top surface is equal to or greater than 10 µm.

3. The free-standing substrate of claim 2, wherein a ratio DT/DB of said average cross-sectional diameter DT at said outermost surfaces of said monocrystalline particles exposed on said top surface and said average cross-sectional diameter DB at said outermost surfaces of said monocrystalline particles exposed on said bottom surface exceeds 1.0.

4. The free-standing substrate of claim 1, wherein said crystal orientations of said monocrystalline particles constituting said free-standing substrate are of non-orientation in a plate face direction orthogonal to said normal direction of said substrate.

5. A light emitting device comprising: said free-standing substrate of claim 1; and
a light emitting functional layer formed on said free-standing substrate and having at least one layer having a single crystal structure in approximately a normal direction and comprising a plurality of semiconductor monocrystalline particles.

6. The free-standing substrate of claim 1, wherein the free-standing substrate is observed as a single crystal when viewed in the normal direction and forms a cluster of monocrystalline particles each having a columnar structure when viewed on the horizontal cross-section.

7. A free-standing substrate of a polycrystalline nitride of a group 13 element comprising a plurality of monocrystalline particles having a particular crystal orientation in approximately a normal direction,
wherein said free-standing substrate having a top surface and a bottom surface,
said polycrystalline nitride of said group 13 element comprises gallium nitride, aluminum nitride, indium nitride or a mixed crystal thereof and contains calcium at a concentration of $5 \times 10^{15}$ atoms/cm$^3$ or more and $1 \times 10^{19}$ atoms/cm$^3$ or less,
crystal orientations of said monocrystalline particles measured through inverse pole figure mapping of electron back scatter diffraction on said top surface are inclined with respect to said particular crystal orientation, and
an average of inclination angles of said crystal orientations with respect to said particular crystal orientation is equal to or greater than 0.1 degrees and smaller than 1 degree.

8. The free-standing substrate of claim 7, further comprising germanium.

9. The free-standing substrate of claim 7, wherein an average cross-sectional diameter DT at outermost surfaces of said monocrystalline particles exposed on said top surface is equal to or greater than 10 µm.

10. The free-standing substrate of claim 9, wherein DT/DB of said average cross-sectional diameter DT at said outermost surfaces of said monocrystalline particles exposed on said top surface and an average cross-sectional diameter DB at said outermost surfaces of said monocrystalline particles exposed on said bottom surface exceeds 1.0.

11. The free-standing substrate of claim 7, wherein said crystal orientations of said monocrystalline particles constituting said free-standing substrate are of non-orientation in a plate face direction orthogonal to said normal direction of said substrate.

12. A light emitting device comprising:
   the free-standing substrate of claim 7; and
   a light emitting functional layer formed on said free-standing substrate and having at least one layer having a single crystal structure in approximately said normal direction and comprising a plurality of semiconductor monocrystalline particles.

13. The free-standing substrate of claim 7, wherein the free-standing substrate is observed as a single crystal when viewed in the normal direction and forms a cluster of monocrystalline particles each having a columnar structure when viewed on the horizontal cross-section.

* * * * *